US010996720B2

(12) United States Patent
Hu et al.

(10) Patent No.: US 10,996,720 B2
(45) Date of Patent: May 4, 2021

(54) PREVENTING PROTECTIVE CASE FROM TURNING OFF SCREEN BY MISTAKE ON TERMINAL USING HALL EFFECT SENSOR

(71) Applicant: Huawei Technologies Co., Ltd., Shenzhen (CN)

(72) Inventors: Jiafu Hu, Shenzhen (CN); Haojie Zhang, Wuhan (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/347,121

(22) PCT Filed: Sep. 1, 2017

(86) PCT No.: PCT/CN2017/100259
§ 371 (c)(1),
(2) Date: May 2, 2019

(87) PCT Pub. No.: WO2018/082393
PCT Pub. Date: May 11, 2018

(65) Prior Publication Data
US 2019/0278337 A1 Sep. 12, 2019

(30) Foreign Application Priority Data

Nov. 3, 2016 (CN) .......................... 201610973390.X
Dec. 29, 2016 (WO) ................ PCT/CN2016/113281
May 22, 2017 (CN) ........................... 201710365478.8

(51) Int. Cl.
*G06F 1/16* (2006.01)
*A45C 11/00* (2006.01)
(Continued)

(52) U.S. Cl.
CPC ............ *G06F 1/1677* (2013.01); *A45C 11/00* (2013.01); *G01R 33/072* (2013.01);
(Continued)

(58) Field of Classification Search
CPC .......... G06F 1/16; G06F 3/041; G06F 3/0412; G06F 1/1637; G06F 3/0416; G06F 1/1681; G06F 3/044; G06F 3/0488
See application file for complete search history.

(56) References Cited

U.S. PATENT DOCUMENTS 9,163,775 B2 * 10/2015 Rohrbach ............ H05K 1/0216
2010/0079395 A1 * 4/2010 Kim ...................... G06F 1/1626
345/173
(Continued)

FOREIGN PATENT DOCUMENTS

CN          1360689 A     7/2002
CN        101233472 A     7/2008
(Continued)

OTHER PUBLICATIONS

Foreign Communication From A Counterpart Application, European Application No. 17868456.9, Extended European Search Report dated Sep. 20, 2019, 8 pages.
(Continued)

*Primary Examiner* — Olga V Merkoulova

(57) ABSTRACT

In a terminal control method, a terminal may be disposed with two Hall effect sensors for sensing a change of a magnetic field generated by a magnet in a protective case, and identify a forward snap-fit operation, an opening operation, a backward snap-fit operation, and the like of the protective case. When detecting the forward snap-fit operation of the protective case, the terminal performs a screen off operation; or when detecting the backward snap-fit operation of the protective case, the terminal may skip performing screen off operation. Thus, the protective case can be prevented from turning off a screen by mistake.

16 Claims, 19 Drawing Sheets

(51) Int. Cl.
  G01R 33/07     (2006.01)
  G06F 1/3206    (2019.01)
  H04B 1/3888    (2015.01)
  H04M 1/02      (2006.01)
  H04M 1/04      (2006.01)
  H04M 1/18      (2006.01)
  G06F 1/3234    (2019.01)

(52) U.S. Cl.
  CPC .......... *G06F 1/1626* (2013.01); *G06F 1/3206* (2013.01); *G06F 1/3265* (2013.01); *H04B 1/3888* (2013.01); *H04M 1/0245* (2013.01); *H04M 1/04* (2013.01); *H04M 1/185* (2013.01); *A45C 2011/002* (2013.01); *G06F 2200/1634* (2013.01)

(56) References Cited

U.S. PATENT DOCUMENTS

| | | | |
|---|---|---|---|
| 2010/0295802 A1* | 11/2010 | Lee | G06F 1/1647 345/173 |
| 2010/0298032 A1 | 11/2010 | Lee et al. | |
| 2012/0068798 A1* | 3/2012 | Lauder | G06F 1/1613 335/306 |
| 2012/0105488 A1* | 5/2012 | Kondo | G06F 3/0488 345/676 |
| 2012/0194308 A1* | 8/2012 | Lauder | G06F 1/1626 335/219 |
| 2013/0017814 A1 | 1/2013 | Ali et al. | |
| 2013/0300679 A1* | 11/2013 | Oh | A45C 11/00 345/173 |
| 2013/0328917 A1 | 12/2013 | Zambetti et al. | |
| 2014/0159867 A1* | 6/2014 | Sartee | G08B 5/36 340/6.1 |
| 2014/0205799 A1* | 7/2014 | Lin | G01B 7/31 428/138 |
| 2014/0268517 A1* | 9/2014 | Moon | H04M 1/0214 361/679.01 |
| 2014/0274214 A1* | 9/2014 | Kim | G06F 3/048 455/566 |
| 2014/0274217 A1* | 9/2014 | Lee | H04B 1/3888 455/566 |
| 2014/0298062 A1* | 10/2014 | Lee | G06F 1/1626 713/323 |
| 2014/0306553 A1* | 10/2014 | Lee | G06F 1/3234 307/326 |
| 2015/0049426 A1* | 2/2015 | Smith | G06F 1/1628 361/679.27 |
| 2015/0097558 A1* | 4/2015 | Jin | H04B 1/3888 324/226 |
| 2015/0115943 A1 | 4/2015 | Jin et al. | |
| 2015/0169010 A1* | 6/2015 | Shin | G06F 1/1626 361/679.27 |
| 2015/0186093 A1* | 7/2015 | Kim | G06F 1/1632 345/174 |
| 2015/0316394 A1 | 11/2015 | Kim et al. | |
| 2016/0275648 A1* | 9/2016 | Honda | G06F 3/16 |

FOREIGN PATENT DOCUMENTS

| | | |
|---|---|---|
| CN | 101893914 A | 11/2010 |
| CN | 103024137 A | 4/2013 |
| CN | 203070028 U | 7/2013 |
| CN | 103488253 A | 1/2014 |
| CN | 103701961 A | 4/2014 |
| CN | 203896622 U | 10/2014 |
| CN | 104127010 A | 11/2014 |
| CN | 104145228 A | 11/2014 |
| CN | 104375559 A | 2/2015 |
| CN | 104375791 A | 2/2015 |
| CN | 104519166 A | 4/2015 |
| CN | 104539754 A | 4/2015 |
| CN | 104793702 A | 7/2015 |
| CN | 105554260 A | 5/2016 |
| CN | 205581709 U | 9/2016 |
| EP | 2823370 B1 | 1/2016 |
| EP | 2966413 A1 | 1/2016 |
| JP | 2014052880 A | 3/2014 |
| JP | 2014093724 A | 5/2014 |
| JP | 2015119470 A | 6/2015 |
| JP | 2016062615 A | 4/2016 |
| JP | 2016076045 A | 5/2016 |
| JP | 2017054353 A | 3/2017 |
| JP | 2017228109 A | 12/2017 |

OTHER PUBLICATIONS

Machine Translation and Abstract of Chinese Publication No. CN104375559, Feb. 25, 2015, 21 pages.
Machine Translation and Abstract of Chinese Publication No. CN104375791, Feb. 25, 2015, 21 pages.
Foreign Communication From A Counterpart Application, Chinese Application No. 201780012512.1, Chinese Office Action dated Dec. 24, 2019, 11 pages.
Machine Translation and Abstract of Chinese Publication No. CN103701961, Apr. 2, 2014, 8 pages.
Machine Translation and Abstract of Chinese Publication No. CN104539754, Apr. 22, 2015, 9 pages.
Machine Translation and Abstract of Chinese Publication No. CN104793702, Jul. 22, 2015, 12 pages.
Machine Translation and Abstract of Chinese Publication No. CN203070028, Jul. 17, 2013, 14 pages.
Machine Translation and Abstract of Chinese Publication No. CN205581709, Sep. 14, 2016, 9 pages.
Foreign Communication From A Counterpart Application, PCT Application No. PCT/CN2016/113281, English Translation of International Search Report dated Aug. 2, 2017, 2 pages.
Foreign Communication From A Counterpart Application, PCT Application No. PCT/CN2016/113281, English Translation of Written Opinion dated Aug. 2, 2017, 4 pages.
Foreign Communication From A Counterpart Application, PCT Application No. PCT/CN2017/100259, English Translation of International Search Report dated Nov. 29, 2017, 2 pages.
Foreign Communication From A Counterpart Application, PCT Application No. PCT/CN2017/100259, English Translation of Written Opinion dated Nov. 29, 2017, 5 pages.
Notice of Reasons for Rejection in Japanese Application No. 2019-523826 dated Aug. 31, 2020, with English translation.

* cited by examiner

PREVENTING PROTECTIVE CASE FROM TURNING OFF SCREEN BY MISTAKE ON TERMINAL USING HALL EFFECT SENSOR

CROSS-REFERENCE TO RELATED APPLICATIONS

This application is a national stage application of International Application No. PCT/CN2017/100259 filed on Sep. 1, 2017, which claims priority to Chinese Patent Application No. 201610973390.X filed on Nov. 3, 2016, International Patent Application No. PCT/CN2016/113281, filed on Dec. 29, 2016, and Chinese Patent Application No. 201710365478.8 filed on May 22, 2017. All of the aforementioned applications are hereby incorporated by reference in their entireties.

TECHNICAL FIELD

The present invention relates to the field of terminal technologies, and in particular, to a terminal control method, a protective case, and a terminal.

BACKGROUND

With rapid development of Internet technologies and computer technologies, various terminals such as smartphones and tablet computers have become indispensable communication, entertainment, and life tools in people's life, and protective cases of terminals such as cases of mobile phones are also widely applied to terminals because the cases are equipped with a drop-proof function, a scratch-resistant function, and other functions. Currently, a protective case of a terminal has another auxiliary function such as a screen locking function in addition to a function of protecting the terminal. The terminal is controlled by using the protective case. For example, when a user closes the protective case of the terminal, a screen of the terminal is locked; or when the user opens the protective case, the screen of the terminal is woken up from a screen locked state, thereby reducing power consumption of the terminal, facilitating a user operation, and improving working efficiency.

A terminal is controlled by using an existing protective case according to the following principle: When a user closes the protective case, a Hall effect sensor in a terminal senses a magnetic field change generated by a magnet in a case, and the terminal performs a screen locking operation; or when the user opens the protective case, the Hall effect sensor in the terminal senses a magnetic field change generated by the magnet in the case, and the terminal performs a screen wakeup operation. However, a position explored by using a conventional terminal control method is not an optimal position, and therefore terminal control may be insensitive.

SUMMARY

A purpose of this application is to provide a terminal control method, a protective case, and a terminal, to improve terminal control sensitivity.

According to a first aspect, an embodiment of the present invention provides a terminal control method, including:

performing a target operation in response to an operation of detecting that an output signal of a first Hall effect sensor changes and an output signal of a second Hall effect sensor changes, where the first Hall effect sensor and the first Hall effect sensor output signals by sensing a magnetic field, where the magnetic field is a magnetic field generated by a magnet built in a terminal, or a magnetic field generated by a magnet built in a protective case of the terminal.

In this embodiment of the present invention, a terminal control system includes two Hall effect sensors, a position of the magnet needs to meet response requirements for the two Hall effect sensors to implement control over the terminal, and the position of the magnet that meets a response condition of the terminal is a better position, so as to improve terminal control sensitivity.

In an embodiment of the present invention, the performing a target operation in response to an operation of detecting that an output signal of a first Hall effect sensor changes and an output signal of a second Hall effect sensor changes includes at least one of the following steps:

performing a first operation in response to an operation of detecting that the output signal of the first Hall effect sensor changes into a first signal and the output signal of the second Hall effect sensor changes into a second signal;

performing a second operation in response to an operation of detecting that the output signal of the first Hall effect sensor changes into a third signal and the output signal of the second Hall effect sensor changes into a fourth signal; and performing a third operation in response to an operation of detecting that the output signal of the first Hall effect sensor changes into a fifth signal and the output signal of the second Hall effect sensor changes into a sixth signal, where the first signal is an electrical signal output by the first Hall effect sensor when a magnetic field whose strength is not less than a first magnetic field strength passes through a working plane of the first Hall effect sensor from a first surface of the first Hall effect sensor, and the second signal is an electrical signal output by the second Hall effect sensor when a magnetic field whose strength is not less than a second magnetic field strength passes through a working plane of the second Hall effect sensor from a first surface of the second Hall effect sensor;

the third signal is an electrical signal output by the first Hall effect sensor when the magnetic field whose strength is not less than the first magnetic field strength passes through the working plane of the first Hall effect sensor from a second surface of the first Hall effect sensor, and the fourth signal is an electrical signal output by the second Hall effect sensor when the magnetic field whose strength is not less than the second magnetic field strength passes through the working plane of the second Hall effect sensor from a second surface of the second Hall effect sensor; and the fifth signal is an electrical signal output by the first Hall effect sensor when a magnetic field whose strength is less than the first magnetic field strength passes through the working plane of the first Hall effect sensor, and the sixth signal is an electrical signal output by the second Hall effect sensor when a magnetic field whose strength is less than the second magnetic field strength passes through the working plane of the second Hall effect sensor.

In an embodiment of the present invention, the first operation includes a screen off operation, the second operation includes no operation, and the third operation includes a screen wakeup operation.

In an embodiment of the present invention, the first surface of the first Hall effect sensor and the second surface of the first Hall effect sensor are two opposite surfaces of the first Hall effect sensor, and both the first surface of the first Hall effect sensor and the second surface of the first Hall effect sensor are parallel to the working plane of the first Hall effect sensor; and the first surface of the second Hall effect sensor and the second surface of the second Hall effect sensor are two opposite surfaces of the second Hall effect sensor, and both the first surface of the second Hall effect sensor and the second surface of the second Hall effect sensor are parallel to the working plane of the Hall effect sensor.

In this embodiment of the present invention, positions of the magnet, the first Hall effect sensor, and the second Hall effect sensor are set, so that the first signal and the third signal have opposite polarities, and the second signal and the fourth signal have opposite polarities, thereby avoiding a misoperation of the terminal and improving user experience.

In an embodiment of the present invention, the first Hall effect sensor and the second Hall effect sensor are disposed in the protective case; and before the performing a target operation, the method further includes: receiving an operation indication instruction sent by the protective case, where the operation indication instruction is an instruction that is generated by the protective case based on a change of the output signal of the first Hall effect sensor and a change of the output signal of the second Hall effect sensor and that is sent to the terminal, and is used to instruct the terminal to perform the target operation.

In an embodiment of the present invention, the magnet is a strip magnet, and the protective case includes a base plate and a flip plate that are used to fasten the terminal, and a flip shaft that connects the base plate and the flip plate; and the first Hall effect sensor and the second Hall effect sensor are disposed in the flip plate of the protective case, and the strip magnet is disposed in the terminal or the base plate of the protective case; or the strip magnet is disposed in the flip plate of the protective case, and the first Hall effect sensor and the second Hall effect sensor are disposed in the terminal or the base plate of the protective case.

In an embodiment of the present invention, the magnet is a strip magnet, and the terminal includes a first body, a second body, and a flip shaft that connects the first body and the second body; and the first Hall effect sensor and the second Hall effect sensor are disposed in the first body, and the strip magnet is disposed in the second body.

In an embodiment of the present invention, the working plane of the first Hall effect sensor is parallel to the working plane of the second Hall effect sensor; and when the terminal is in a closed state, a connection line between a north pole of the magnet and a south pole of the magnet is parallel to the working plane of the first Hall effect sensor, and a distance between the first Hall effect sensor or the second Hall effect sensor and a projection of the strip magnet onto a plane on which the working plane of the first Hall effect sensor is located is greater than a first distance threshold.

In an embodiment of the present invention, the magnet includes a first magnet and a second magnet, the first magnet generates the magnetic field whose strength is not less than the first magnetic field strength, and the second magnet generates the magnetic field whose strength is not less than the second magnetic field strength.

According to a second aspect, an embodiment of the present invention further provides a terminal control method, including:

sending, by a protective case, an operation indication instruction to a terminal in response to an operation of detecting that an output signal of a first Hall effect sensor changes and an output signal of a second Hall effect sensor changes, where the operation indication instruction is generated by the protective case based on a change of the output signal of the first Hall effect sensor and a change of the output signal of the second Hall effect sensor, and is used to instruct the terminal to perform a target operation, where the first Hall effect sensor and the first Hall effect sensor output signals by sensing a magnetic field; and the magnetic field is a magnetic field generated by a magnet built in the terminal, or a magnetic field generated by a magnet built in the protective case of the terminal, and the first Hall effect sensor and the second Hall effect sensor are disposed in the protective case.

In this embodiment of the present invention, a terminal control system includes two Hall effect sensors, and a position of the magnet needs to meet response requirements for the two Hall effect sensors to implement control over the terminal. In this way, terminal control is more precise.

In an embodiment of the present invention, the sending, by a protective case, an operation indication instruction to a terminal in response to an operation of detecting that an output signal of a first Hall effect sensor changes and an output signal of a second Hall effect sensor changes includes at least one of the following steps:

sending, by the protective case, a first operation indication instruction to the terminal in response to an operation of detecting that the output signal of the first Hall effect sensor changes into a first signal and the output signal of the second Hall effect sensor changes into a second signal, where the first operation indication instruction is generated by the protective case based on the first signal and the second signal, and is used to instruct the terminal to perform a first operation;

sending, by the protective case, a second operation indication instruction to the terminal in response to an operation of detecting that the output signal of the first Hall effect sensor changes into a third signal and the output signal of the second Hall effect sensor changes into a fourth signal, where the second operation indication instruction is generated by the protective case based on the third signal and the fourth signal, and is used to instruct the terminal to perform a second operation; and sending, by the protective case, a third operation indication instruction to the terminal in response to an operation of detecting that the output signal of the first Hall effect sensor changes into a fifth signal and the output signal of the second Hall effect sensor changes into a sixth signal, where the third operation indication instruction is generated by the protective case based on the fifth signal and the sixth signal, and is used to instruct the terminal to perform a third operation, where the first signal is an electrical signal output by the first Hall effect sensor when a magnetic field whose strength is not less than a first magnetic field strength passes through a working plane of the first Hall effect sensor from a first surface of the first Hall effect sensor, and the second signal is an electrical signal output by the second Hall effect sensor when a magnetic field whose strength is not less than a second magnetic field strength passes through a working plane of the second Hall effect sensor from a first surface of the second Hall effect sensor;

the third signal is an electrical signal output by the first Hall effect sensor when the magnetic field whose strength is not less than the first magnetic field strength passes through the working plane of the first Hall effect sensor from a second surface of the first Hall effect sensor, and the fourth signal is an electrical signal output by the second Hall effect sensor when the magnetic field whose strength is not less than the second magnetic field strength passes through the working plane of the second Hall effect sensor from a second surface of the second Hall effect sensor; and the fifth signal is an electrical signal output by the first Hall effect sensor when a magnetic field whose strength is less than the first magnetic field strength passes through the working plane of the first Hall effect sensor, and the sixth signal is an electrical signal output by the second Hall effect sensor when a magnetic field whose strength is less than the second magnetic field strength passes through the working plane of the second Hall effect sensor.

In an embodiment of the present invention, the first operation includes a screen off operation, the second operation includes no operation, and the third operation includes a screen wakeup operation.

In an embodiment of the present invention, the first surface of the first Hall effect sensor and the second surface of the first Hall effect sensor are two opposite surfaces of the first Hall effect sensor, and both the first surface of the first Hall effect sensor and the second surface of the first Hall effect sensor are parallel to the working plane of the first Hall effect sensor; and the first surface of the second Hall effect sensor and the second surface of the second Hall effect sensor are two opposite surfaces of the second Hall effect sensor, and both the first surface of the second Hall effect sensor and the second surface of the second Hall effect sensor are parallel to the working plane of the Hall effect sensor.

In this embodiment of the present invention, positions of the magnet, the first Hall effect sensor, and the second Hall effect sensor are set, so that the first signal and the third signal have opposite polarities, and the second signal and the fourth signal have opposite polarities, thereby avoiding a misoperation of the terminal and improving user experience.

In an embodiment of the present invention, the protective case includes a base plate and a flip plate that are used to fasten the terminal, and a flip shaft that connects the base plate and the flip plate; and the first Hall effect sensor and the second Hall effect sensor are disposed in the flip plate, and the magnet is disposed in the terminal or the base plate of the protective case; or the first Hall effect sensor and the second Hall effect sensor are disposed in the base plate, and the magnet is disposed in the flip plate.

In an embodiment of the present invention, the magnet is a strip magnet, and the working plane of the first Hall effect sensor is parallel to the working plane of the second Hall effect sensor; and when the protective case is in a closed state, a connection line between a north pole of the magnet and a south pole of the magnet is parallel to the working plane of the first Hall effect sensor, and a distance between the first Hall effect sensor or the second Hall effect sensor and a projection of the strip magnet onto a plane on which the working plane of the first Hall effect sensor is located is greater than a first distance threshold.

In an embodiment of the present invention, the magnet includes a first magnet and a second magnet, the first magnet generates the magnetic field whose strength is not less than the first magnetic field strength, and the second magnet generates the magnetic field whose strength is not less than the second magnetic field strength.

According to a third aspect, an embodiment of the present invention further provides a terminal, including:

a detection unit, configured to detect a change of an output signal of a first Hall effect sensor and a change of an output signal of a second Hall effect sensor; and a processing unit, configured to perform a target operation in response to an operation of detecting that the output signal of the first Hall effect sensor changes and the output signal of the second Hall effect sensor changes, where the first Hall effect sensor and the first Hall effect sensor output signals by sensing a magnetic field; and the magnetic field is a magnetic field generated by a magnet built in the terminal, or a magnetic field generated by a magnet built in a protective case of the terminal.

In an embodiment of the present invention, the processing unit is specifically configured to perform at least one of the following steps:

performing a first operation in response to an operation of detecting that the output signal of the first Hall effect sensor changes into a first signal and the output signal of the second Hall effect sensor changes into a second signal;

performing a second operation in response to an operation of detecting that the output signal of the first Hall effect sensor changes into a third signal and the output signal of the second Hall effect sensor changes into a fourth signal; and performing a third operation in response to an operation of detecting that the output signal of the first Hall effect sensor changes into a fifth signal and the output signal of the second Hall effect sensor changes into a sixth signal, where the first signal is an electrical signal output by the first Hall effect sensor when a magnetic field whose strength is not less than a first magnetic field strength passes through a working plane of the first Hall effect sensor from a first surface of the first Hall effect sensor, and the second signal is an electrical signal output by the second Hall effect sensor when a magnetic field whose strength is not less than a second magnetic field strength passes through a working plane of the second Hall effect sensor from a first surface of the second Hall effect sensor;

the third signal is an electrical signal output by the first Hall effect sensor when the magnetic field whose strength is not less than the first magnetic field strength passes through the working plane of the first Hall effect sensor from a second surface of the first Hall effect sensor, and the fourth signal is an electrical signal output by the second Hall effect sensor when the magnetic field whose strength is not less than the second magnetic field strength passes through the working plane of the second Hall effect sensor from a second surface of the second Hall effect sensor; and the fifth signal is an electrical signal output by the first Hall effect sensor when a magnetic field whose strength is less than the first magnetic field strength passes through the working plane of the first Hall effect sensor, and the sixth signal is an electrical signal output by the second Hall effect sensor when a magnetic field whose strength is less than the second magnetic field strength passes through the working plane of the second Hall effect sensor.

In an embodiment of the present invention, the first surface of the first Hall effect sensor and the second surface of the first Hall effect sensor are two opposite surfaces of the first Hall effect sensor, and both the first surface of the first Hall effect sensor and the second surface of the first Hall effect sensor are parallel to the working plane of the first Hall effect sensor; and the first surface of the second Hall effect sensor and the second surface of the second Hall effect sensor are two opposite surfaces of the second Hall effect sensor, and both the first surface of the second Hall effect sensor and the second surface of the second Hall effect sensor are parallel to the working plane of the Hall effect sensor.

In an embodiment of the present invention, the first Hall effect sensor and the second Hall effect sensor are disposed in the protective case; and the terminal further includes a receiving unit, configured to receive an operation indication instruction sent by the protective case, where the operation indication instruction is an instruction that is generated by the protective case based on the change of the output signal of the first Hall effect sensor and the change of the output signal of the second Hall effect sensor and that is sent to the terminal, and is used to instruct the terminal to perform the target operation.

In an embodiment of the present invention, the magnet is a strip magnet, and the protective case includes a base plate and a flip plate that are used to fasten the terminal, and a flip shaft that connects the base plate and the flip plate; and the first Hall effect sensor and the second Hall effect sensor are disposed in the flip plate of the protective case, and the strip magnet is disposed in the terminal or the base plate of the protective case; or the strip magnet is disposed in the flip plate of the protective case, and the first Hall effect sensor and the second Hall effect sensor are disposed in the terminal or the base plate of the protective case.

In an embodiment of the present invention, the magnet is a strip magnet, and the terminal includes a first body, a second body, and a flip shaft that connects the first body and the second body; and the first Hall effect sensor and the second Hall effect sensor are disposed in the first body, and the strip magnet is disposed in the second body.

In an embodiment of the present invention, the working plane of the first Hall effect sensor is parallel to the working plane of the second Hall effect sensor; and when the terminal is in a closed state, a connection line between a north pole of the magnet and a south pole of the magnet is parallel to the working plane of the first Hall effect sensor, and a distance between the first Hall effect sensor or the second Hall effect sensor and a projection of the strip magnet onto a plane on which the working plane of the first Hall effect sensor is located is greater than a first distance threshold.

In an embodiment of the present invention, the magnet includes a first magnet and a second magnet, the first magnet generates the magnetic field whose strength is not less than the first magnetic field strength, and the second magnet generates the magnetic field whose strength is not less than the second magnetic field strength.

According to a fourth aspect, an embodiment of the present invention further provides a protective case, including:

a detection unit, configured to detect an output signal of a first Hall effect sensor and an output signal of a second Hall effect sensor; and a sending unit, configured to send an operation indication instruction to a terminal in response to an operation of detecting that the output signal of the first Hall effect sensor changes and the output signal of the second Hall effect sensor changes, where the operation indication instruction is generated by the protective case based on a change of the output signal of the first Hall effect sensor and a change of the output signal of the second Hall effect sensor, and is used to instruct the terminal to perform a target operation, where the first Hall effect sensor and the first Hall effect sensor output signals by sensing a magnetic field; and the magnetic field is a magnetic field generated by a magnet built in the terminal, or a magnetic field generated by a magnet built in the protective case of the terminal, and the first Hall effect sensor and the second Hall effect sensor are disposed in the protective case.

In an embodiment of the present invention, the sending unit is specifically configured to perform at least one of the following steps:

sending a first operation indication instruction to the terminal in response to an operation of detecting that the output signal of the first Hall effect sensor changes into a first signal and the output signal of the second Hall effect sensor changes into a second signal, where the first operation indication instruction is generated by the protective case based on the first signal and the second signal, and is used to instruct the terminal to perform a first operation;

sending a second operation indication instruction to the terminal in response to an operation of detecting that the output signal of the first Hall effect sensor changes into a third signal and the output signal of the second Hall effect sensor changes into a fourth signal, where the second operation indication instruction is generated by the protective case based on the third signal and the fourth signal, and is used to instruct the terminal to perform a second operation; and sending a third operation indication instruction to the terminal in response to an operation of detecting that the output signal of the first Hall effect sensor changes into a fifth signal and the output signal of the second Hall effect sensor changes into a sixth signal, where the third operation indication instruction is generated by the protective case based on the fifth signal and the sixth signal, and is used to instruct the terminal to perform a third operation, where the first signal is an electrical signal output by the first Hall effect sensor when a magnetic field whose strength is not less than a first magnetic field strength passes through a working plane of the first Hall effect sensor from a first surface of the first Hall effect sensor, and the second signal is an electrical signal output by the second Hall effect sensor when a magnetic field whose strength is not less than a second magnetic field strength passes through a working plane of the second Hall effect sensor from a first surface of the second Hall effect sensor;

the third signal is an electrical signal output by the first Hall effect sensor when the magnetic field whose strength is not less than the first magnetic field strength passes through the working plane of the first Hall effect sensor from a second surface of the first Hall effect sensor, and the fourth signal is an electrical signal output by the second Hall effect sensor when the magnetic field whose strength is not less than the second magnetic field strength passes through the working plane of the second Hall effect sensor from a second surface of the second Hall effect sensor; and the fifth signal is an electrical signal output by the first Hall effect sensor when a magnetic field whose strength is less than the first magnetic field strength passes through the working plane of the first Hall effect sensor, and the sixth signal is an electrical signal output by the second Hall effect sensor when a magnetic field whose strength is less than the second magnetic field strength passes through the working plane of the second Hall effect sensor.

In an embodiment of the present invention, the first surface of the first Hall effect sensor and the second surface of the first Hall effect sensor are two opposite surfaces of the first Hall effect sensor, and both the first surface of the first Hall effect sensor and the second surface of the first Hall effect sensor are parallel to the working plane of the first Hall effect sensor; and the first surface of the second Hall effect sensor and the second surface of the second Hall effect sensor are two opposite surfaces of the second Hall effect sensor, and both the first surface of the second Hall effect sensor and the second surface of the second Hall effect sensor are parallel to the working plane of the Hall effect sensor.

In an embodiment of the present invention, the protective case includes a base plate and a flip plate that are used to fasten the terminal, and a flip shaft that connects the base plate and the flip plate; and the first Hall effect sensor and the second Hall effect sensor are disposed in the flip plate, and the magnet is disposed in the terminal or the base plate of the protective case; or the first Hall effect sensor and the second Hall effect sensor are disposed in the base plate, and the magnet is disposed in the flip plate.

In an embodiment of the present invention, the magnet is a strip magnet, and the working plane of the first Hall effect sensor is parallel to the working plane of the second Hall effect sensor; and when the protective case is in a closed state, a connection line between a north pole of the magnet and a south pole of the magnet is parallel to the working plane of the first Hall effect sensor, and a distance between the first Hall effect sensor or the second Hall effect sensor and a projection of the strip magnet onto a plane on which the working plane of the first Hall effect sensor is located is greater than a first distance threshold.

In an embodiment of the present invention, the magnet includes a first magnet and a second magnet, the first magnet generates the magnetic field whose strength is not less than the first magnetic field strength, and the second magnet generates the magnetic field whose strength is not less than the second magnetic field strength.

According to a fifth aspect, an embodiment of the present invention further provides a terminal, including a processor and a memory, where the processor is connected to the memory, and the processor is configured to invoke program code in the memory to perform the following step:

performing a target operation in response to an operation of detecting that an output signal of a first Hall effect sensor changes and an output signal of a second Hall effect sensor changes, where the first Hall effect sensor and the first Hall effect sensor output signals by sensing a magnetic field, where the magnetic field is a magnetic field generated by a magnet built in the terminal, or a magnetic field generated by a magnet built in a protective case of the terminal.

In an embodiment of the present invention, that the processor performs a target operation in response to an operation of detecting that an output signal of a first Hall effect sensor changes and an output signal of a second Hall effect sensor changes specifically includes at least one of the following steps:

performing a first operation in response to an operation of detecting that the output signal of the first Hall effect sensor changes into a first signal and the output signal of the second Hall effect sensor changes into a second signal;

performing a second operation in response to an operation of detecting that the output signal of the first Hall effect sensor changes into a third signal and the output signal of the second Hall effect sensor changes into a fourth signal; and performing a third operation in response to an operation of detecting that the output signal of the first Hall effect sensor changes into a fifth signal and the output signal of the second Hall effect sensor changes into a sixth signal, where the first signal is an electrical signal output by the first Hall effect sensor when a magnetic field whose strength is not less than a first magnetic field strength passes through a working plane of the first Hall effect sensor from a first surface of the first Hall effect sensor, and the second signal is an electrical signal output by the second Hall effect sensor when a magnetic field whose strength is not less than a second magnetic field strength passes through a working plane of the second Hall effect sensor from a first surface of the second Hall effect sensor;

the third signal is an electrical signal output by the first Hall effect sensor when the magnetic field whose strength is not less than the first magnetic field strength passes through the working plane of the first Hall effect sensor from a second surface of the first Hall effect sensor, and the fourth signal is an electrical signal output by the second Hall effect sensor when the magnetic field whose strength is not less than the second magnetic field strength passes through the working plane of the second Hall effect sensor from a second surface of the second Hall effect sensor; and the fifth signal is an electrical signal output by the first Hall effect sensor when a magnetic field whose strength is less than the first magnetic field strength passes through the working plane of the first Hall effect sensor, and the sixth signal is an electrical signal output by the second Hall effect sensor when a magnetic field whose strength is less than the second magnetic field strength passes through the working plane of the second Hall effect sensor.

In an embodiment of the present invention, the first surface of the first Hall effect sensor and the second surface of the first Hall effect sensor are two opposite surfaces of the first Hall effect sensor, and both the first surface of the first Hall effect sensor and the second surface of the first Hall effect sensor are parallel to the working plane of the first Hall effect sensor; and the first surface of the second Hall effect sensor and the second surface of the second Hall effect sensor are two opposite surfaces of the second Hall effect sensor, and both the first surface of the second Hall effect sensor and the second surface of the second Hall effect sensor are parallel to the working plane of the Hall effect sensor.

In an embodiment of the present invention, the first Hall effect sensor and the second Hall effect sensor are disposed in the protective case, and the processor includes a communications module; and before performing the target operation, the processor is further configured to receive, by using the communications module, an operation indication instruction sent by the protective case, where the operation indication instruction is an instruction that is generated by the protective case based on a change of the output signal of the first Hall effect sensor and a change of the output signal of the second Hall effect sensor and that is sent to the terminal, and is used to instruct the terminal to perform the target operation.

In an embodiment of the present invention, the magnet is a strip magnet, and the protective case includes a base plate and a flip plate that are used to fasten the terminal, and a flip shaft that connects the base plate and the flip plate; and the first Hall effect sensor and the second Hall effect sensor are disposed in the flip plate of the protective case, and the strip magnet is disposed in the terminal or the base plate of the protective case; or the strip magnet is disposed in the flip plate of the protective case, and the first Hall effect sensor and the second Hall effect sensor are disposed in the terminal or the base plate of the protective case.

In an embodiment of the present invention, the magnet is a strip magnet, and the terminal includes a first body, a second body, and a flip shaft that connects the first body and the second body; and the first Hall effect sensor and the second Hall effect sensor are disposed in the first body, and the strip magnet is disposed in the second body.

In an embodiment of the present invention, the working plane of the first Hall effect sensor is parallel to the working plane of the second Hall effect sensor; and when the terminal is in a closed state, a connection line between a north pole of the magnet and a south pole of the magnet is parallel to the working plane of the first Hall effect sensor, and a distance between the first Hall effect sensor or the second Hall effect sensor and a projection of the strip magnet onto a plane on which the working plane of the first Hall effect sensor is located is greater than a first distance threshold.

In an embodiment of the present invention, the magnet includes a first magnet and a second magnet, the first magnet generates the magnetic field whose strength is not less than the first magnetic field strength, and the second magnet generates the magnetic field whose strength is not less than the second magnetic field strength.

According to a sixth aspect, an embodiment of the present invention further provides a protective case, including a base plate and a flip plate that are used to fasten the terminal, and a flip shaft that connects the base plate and the flip plate, where a status of the protective case may change by using the flip shaft, where a first Hall effect sensor and a second Hall effect sensor are disposed in the flip plate, and a magnet is disposed in the terminal or the base plate; or a first Hall effect sensor and a second Hall effect sensor are disposed in the base plate or the terminal, and the magnet is disposed in the flip plate;

the first Hall effect sensor and the first Hall effect sensor output signals by sensing a magnetic field; and the protective case is configured to instruct, in response to a status change of the protective case, the terminal to perform a target operation based on a change of an output signal of the first Hall effect sensor and a change of an output signal of the second Hall effect sensor.

In an embodiment of the present invention, when the protective case is in a flip-up state, a magnetic field whose strength is not less than a first magnetic field strength and that is generated by the magnet passes through a working plane of the first Hall effect sensor from the first surface, and the first Hall effect sensor outputs a first signal; and a magnetic field whose strength is not less than a second magnetic field strength and that is generated by the magnet passes through a working plane of the second Hall effect sensor from the first surface, and the second Hall effect sensor outputs a second signal;

when the protective case is in a flip-back state, the magnetic field whose strength is not less than the first magnetic field strength and that is generated by the magnet passes through the working plane of the first Hall effect sensor from the second surface, and the first Hall effect sensor outputs a third signal; and the magnetic field whose strength is not less than the second magnetic field strength and that is generated by the magnet passes through the working plane of the second Hall effect sensor from the second surface, and the second Hall effect sensor outputs a fourth signal; and when the protective case is in an expanded state, a magnetic field whose strength is less than the first magnetic field strength and that is generated by the magnet passes through the working plane of the first Hall effect sensor, and the first Hall effect sensor outputs a fifth signal; and a magnetic field whose strength is less than the second magnetic field strength and that is generated by the magnet passes through the working plane of the second Hall effect sensor, and the second Hall effect sensor outputs a sixth signal.

In an embodiment of the present invention, the first surface of the first Hall effect sensor and the second surface of the first Hall effect sensor are two opposite surfaces of the first Hall effect sensor, and both the first surface of the first Hall effect sensor and the second surface of the first Hall effect sensor are parallel to the working plane of the first Hall effect sensor; and the first surface of the second Hall effect sensor and the second surface of the second Hall effect sensor are two opposite surfaces of the second Hall effect sensor, and both the first surface of the second Hall effect sensor and the second surface of the second Hall effect sensor are parallel to the working plane of the Hall effect sensor.

In an embodiment of the present invention, the magnet is a strip magnet, and the working plane of the first Hall effect sensor is parallel to the working plane of the second Hall effect sensor; and when the protective case is in a closed state, a connection line between a north pole of the magnet and a south pole of the magnet is parallel to the working plane of the first Hall effect sensor, and a distance between the first Hall effect sensor or the second Hall effect sensor and a projection of the strip magnet onto a plane on which the working plane of the first Hall effect sensor is located is greater than a first distance threshold.

In an embodiment of the present invention, when the first Hall effect sensor and the second Hall effect sensor are disposed in the protective case, the protective case further includes a processor, a memory, and a communications module, where the processor is connected to the memory, the first Hall effect sensor, the second Hall effect sensor, and the communications module, and the processor is configured to invoke program code stored in the memory to perform the following step:

sending, by using the communications module, an operation indication instruction to the terminal in response to an operation of detecting that the output signal of the first Hall effect sensor changes and the output signal of the second Hall effect sensor changes, where the operation indication instruction is generated by the protective case based on the change of the output signal of the first Hall effect sensor and the change of the output signal of the second Hall effect sensor, and is used to instruct the terminal to perform the target operation.

In an embodiment of the present invention, the sending, by using the communications module, an operation indication instruction to the terminal in response to an operation of detecting that the output signal of the first Hall effect sensor changes and the output signal of the second Hall effect sensor changes includes at least one of the following steps:

sending, by using the communications module, a first operation indication instruction to the terminal in response to an operation of detecting that the output signal of the first Hall effect sensor changes into the first signal and the output signal of the second Hall effect sensor changes into the second signal, where the first operation indication instruction is generated by the protective case based on the first signal and the second signal, and is used to instruct the terminal to perform a first operation;

sending, by using the communications module, a second operation indication instruction to the terminal in response to an operation of detecting that the output signal of the first Hall effect sensor changes into the third signal and the output signal of the second Hall effect sensor changes into the fourth signal, where the second operation indication instruction is generated by the protective case based on the third signal and the fourth signal, and is used to instruct the terminal to perform a second operation; and sending, by using the communications module, a third operation indication instruction to the terminal in response to an operation of detecting that the output signal of the first Hall effect sensor changes into the fifth signal and the output signal of the second Hall effect sensor changes into the sixth signal, where the third operation indication instruction is generated by the protective case based on the fifth signal and the sixth signal, and is used to instruct the terminal to perform a third operation.

In an embodiment of the present invention, the magnet includes a first magnet and a second magnet, the first magnet generates the magnetic field whose strength is not less than the first magnetic field strength, and the second magnet generates the magnetic field whose strength is not less than the second magnetic field strength.

According to a seventh aspect, an embodiment of the present invention provides a computer storage medium, configured to store a computer software instruction used by the terminal described in the first aspect, where when the instruction is executed by the terminal, the terminal performs the method according to the first aspect.

According to an eighth aspect, an embodiment of the present invention provides a computer storage medium, configured to store a computer software instruction used by the protective case described in the second aspect, where when the instruction is executed by the protective case, the terminal performs the method according to the second aspect.

According to a ninth aspect, an embodiment of the present invention provides a computer program, where the program includes a computer software instruction, and when the instruction is executed by a terminal, the terminal performs the method according to the first aspect.

According to a tenth aspect, an embodiment of the present invention provides a computer program, where the program includes a computer software instruction, and when the instruction is executed by the protective case, the protective case performs the method according to the second aspect.

BRIEF DESCRIPTION OF DRAWINGS

To describe the technical solutions in the embodiments of the present invention more clearly, the following briefly describes the accompanying drawings required for describing the embodiments or the prior art.

DESCRIPTION OF EMBODIMENTS

The following clearly describes the technical solutions in the embodiments of the present invention with reference to the accompanying drawings in the embodiments of the present invention.

Figure 1:
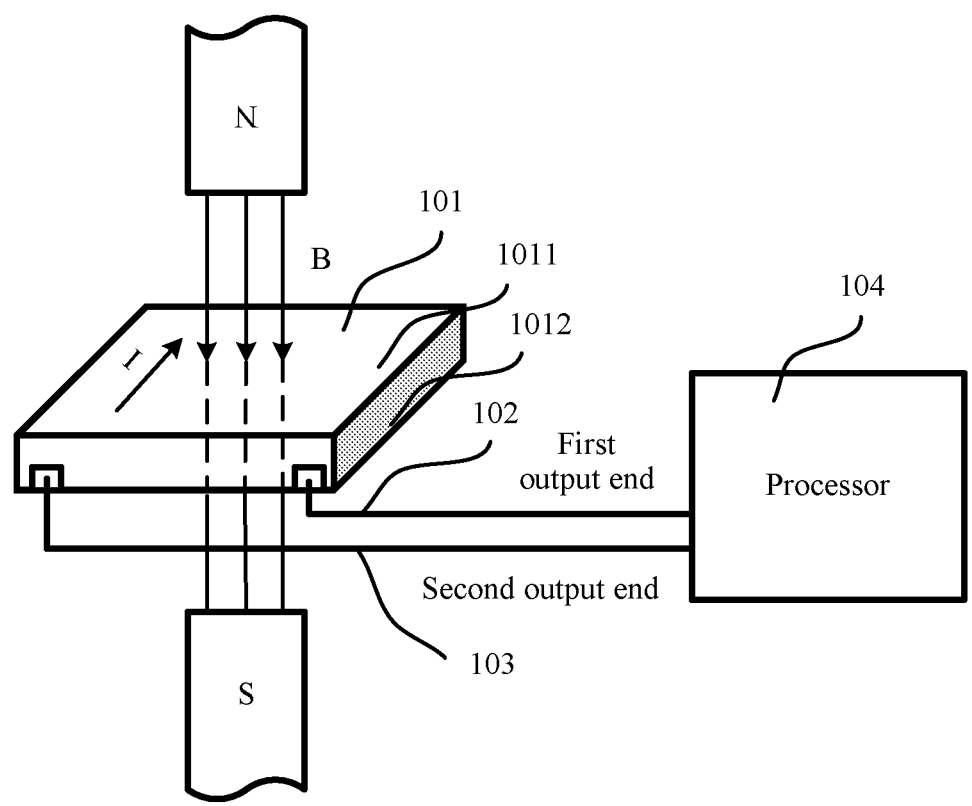
FIG. 1 is an illustrative schematic diagram of a working principle of a Hall effect sensor according to an embodiment of the present invention.

Referring to FIG. 1, FIG. 1 is an illustrative schematic diagram of a working principle of a Hall effect sensor according to an embodiment of the present invention. As shown in FIG. 1, a Hall effect sensor 101 includes a semiconductor wafer made of a semiconductor material, and a working plane of the Hall effect sensor is a plane of the Hall effect sensor for sensing a magnetic field, namely, a plane on which the semiconductor wafer is located. When the Hall effect sensor 101 operates, if a current is applied to the semiconductor wafer, and a magnetic field is applied in a vertical direction of the wafer, the wafer has an electric potential difference in a direction that is vertical to the current and the magnetic field. For example, when the magnetic field passes through the Hall effect sensor 101 from a first surface (an upper surface) 1011 of the Hall effect sensor, a first output end 102 of the Hall effect sensor outputs a low-level signal, and a second output end 103 outputs a high-level signal; on the contrary, when the magnetic field passes through the Hall effect sensor from a second surface (a lower surface) 1012 of the Hall effect sensor, the first output end 102 of the Hall effect sensor outputs a high-level signal, and the second output end 103 outputs a low-level signal. A relative position relationship between a magnet that generates the magnetic field and the Hall effect sensor may be determined by using different outputs of the first output end 102 and the second output end 103.

It should be noted that in FIG. 1, the Hall effect sensor including two voltage signal output ends is used as an example to describe the working principle of the Hall effect sensor. In this embodiment of the present invention, alternatively, the Hall effect sensor may include one output end, three output ends, or the like. An output signal of each output end may be a voltage signal or a current signal, and this is not limited in the present invention. When the magnetic field passes through the working plane of the Hall effect sensor, an output end of the Hall effect sensor outputs an electrical signal in a voltage or current form. When the magnetic field passes through the working plane of the Hall effect sensor from different directions, different electrical signals are output. The different electrical signals are used to instruct a processor of a terminal to perform different operations, so as to implement control over the terminal.

Figure 2:
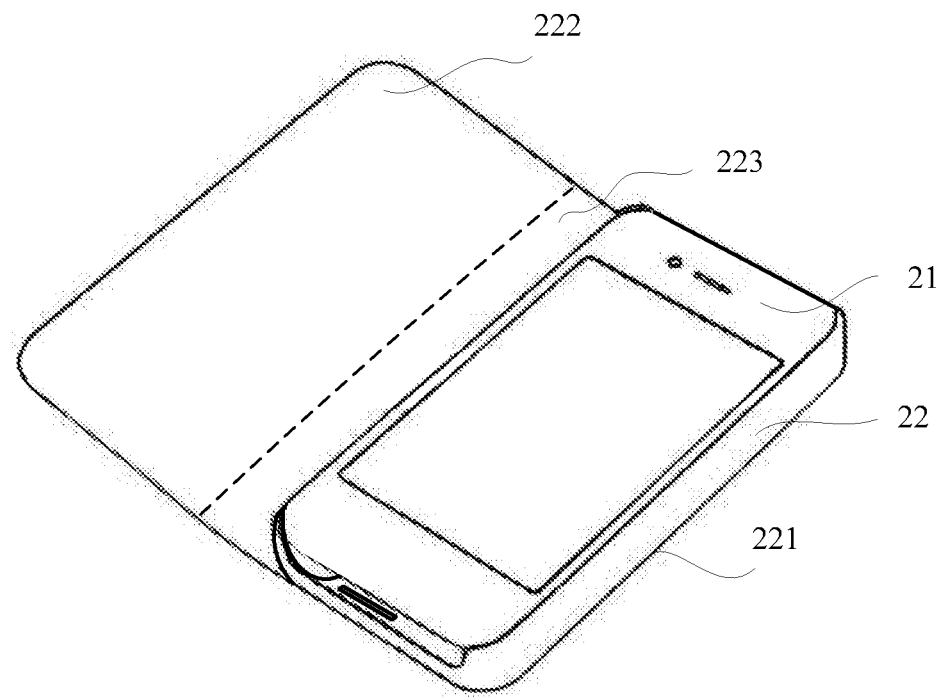
FIG. 2 is a system framework diagram of a terminal control system according to an embodiment of the present invention.

Referring to FIG. 2, FIG. 2 is a system framework diagram of a terminal control system according to an embodiment of the present invention. An embodiment of a terminal control method in the present invention may be implemented based on a structural framework diagram of the terminal control system. The terminal control system shown in FIG. 2 may include a terminal 21 and a protective case 22. FIG. 2 is a schematic diagram of positions of the protective case 22 and the terminal 21 in the terminal control system when the protective case 22 is in an operating state (in other words, the terminal 21 is disposed in the protective case 22). The protective case 22 may include a base plate 221 and a flip plate 222 that are used to fasten the terminal 21, and a flip shaft 223 that connects the base plate 221 and the flip plate 222. Optionally, the base plate 221, the flip plate 222, and the flip shaft 223 may be integrated together. A first Hall effect sensor and a second Hall effect sensor are disposed in the base plate 221 or the terminal 21, and a magnet is disposed in the flip plate 222; or a first Hall effect sensor and a second Hall effect sensor are disposed in the flip plate 222, and a magnet is disposed in the base plate 221 or the terminal 21.

A status of the protective case 22 may include a flip-up state, an expanded state, and a flip-back state.

It may be understood that the flip-up state of the protective case 22 includes a closed state of the protective case 22 and a half-closed state of the protective case 22.

Figure 3A:
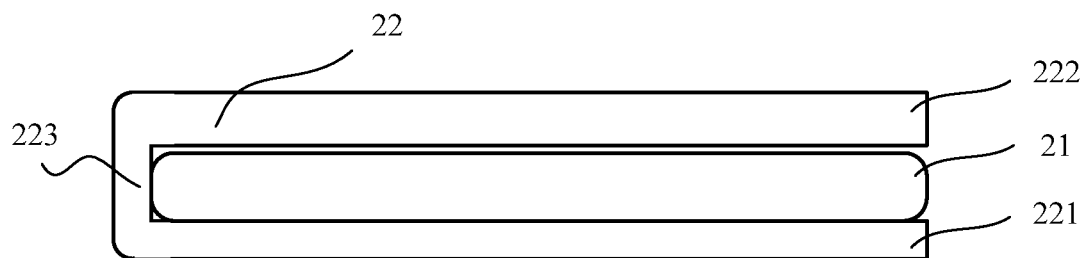
FIG. 3A is a cross-sectional schematic diagram of a protective case in a closed state according to an embodiment of the present invention.

The closed state of the protective case 22 is a state in which the flip plate 222 of the protective case 22 covers the terminal 21 fastened on the base plate 221, and a plane on which the flip plate 222 is located is parallel to a plane on which the base plate 221 is located. Referring to FIG. 3A, FIG. 3A is a cross-sectional schematic diagram of a protective case in a closed state according to an embodiment of the present invention. When the protective case 22 operates, the flip plate 222 of the protective case 22 in the closed state covers the terminal 21 fastened on the base plate 221.

Figure 3B:
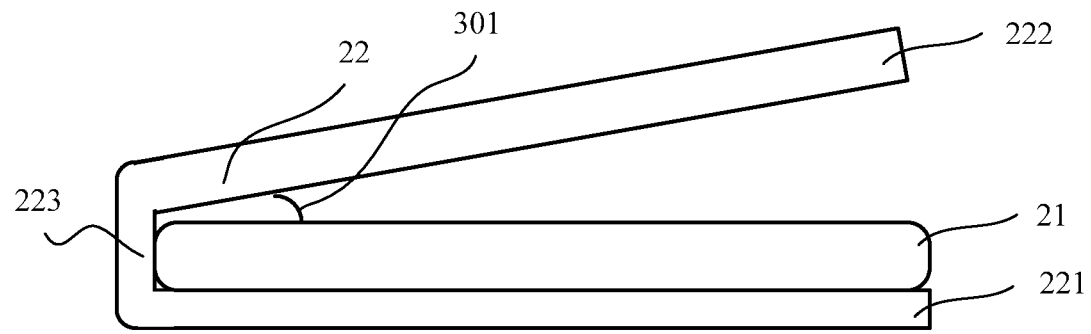
FIG. 3B is a cross-sectional schematic diagram of a protective case in a half-closed state according to an embodiment of the present invention.

The half-closed state of the protective case 22 is a state in which a first included angle is formed between the flip plate 222 of the protective case 22 and a plane that is of the terminal 21 fastened on the base plate 221 and that is away from the base plate 221, and the first included angle is less than a first angle threshold. The first angle threshold is a maximum included angle when a magnetic field generated by the magnet can trigger the first Hall effect sensor to output a first signal and the second Hall effect sensor to output a second signal. Referring to FIG. 3B, FIG. 3B is a cross-sectional schematic diagram of a protective case in a half-closed state according to an embodiment of the present invention. When the protective case 22 operates, a first included angle 301 is formed between the flip plate 222 of the protective case 22 in the half-closed state and the base plate 221 on which the terminal 21 is fastened.

It may be understood that the flip-back state of the protective case 22 includes a flipped state of the protective case 22 and a half-flipped state of the protective case 22.

Figure 3C:
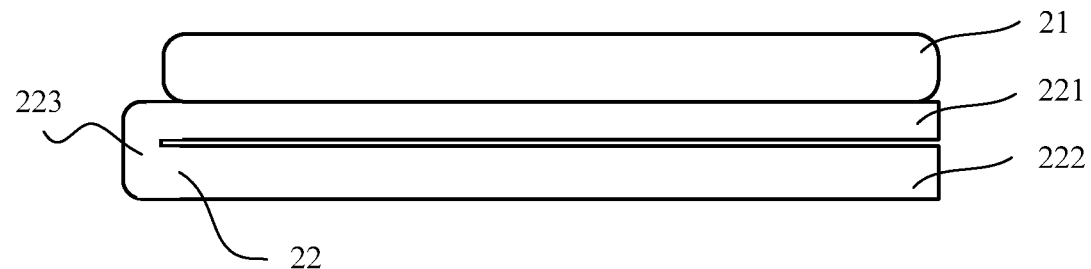
FIG. 3C is a cross-sectional schematic diagram of a protective case in a flipped state according to an embodiment of the present invention.

The flipped state of the protective case 22 is a state in which the flip plate 222 of the protective case 22 is located under the base plate 221, and the plane on which the flip plate 222 is located is parallel to the plane on which the base plate 221 is located. Referring to FIG. 3C, FIG. 3C is a cross-sectional schematic diagram of a protective case in a flipped state according to an embodiment of the present invention. When the protective case 22 operates, the flip plate 222 of the protective case 22 in the flipped state faces away from the base plate 221 on which the terminal 21 is fastened.

Figure 3D:
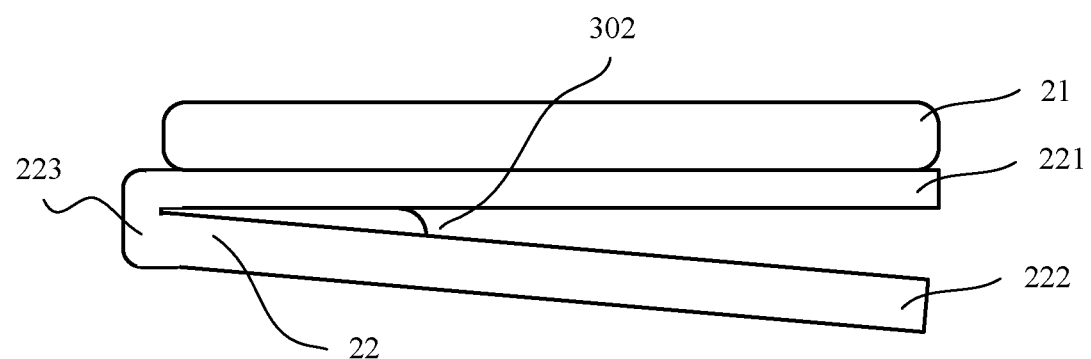
FIG. 3D is a cross-sectional schematic diagram of a protective case in a half-flipped state according to an embodiment of the present invention.

The half-flipped state of the protective case 22 is a state in which a second included angle 225 is formed between the flip plate 222 of the protective case 22 and a plane that is of the base plate 221 and that is away from the terminal 21 fastened on the base plate 221, and the second included angle is less than a second angle threshold. In an embodiment of the present invention, the second angle threshold is a maximum included angle when the first Hall effect sensor can be triggered to output a third signal and the second Hall effect sensor can be triggered to output a fourth signal. Referring to FIG. 3D, FIG. 3D is a cross-sectional schematic diagram of a protective case in a half-flipped state according to an embodiment of the present invention. When the protective case 22 operates, the flip plate 222 of the protective case 22 in the half-flipped state faces away from the base plate 221 on which the terminal 21 is fastened, and therefore a second included angle 302 is formed.

Figure 3E:
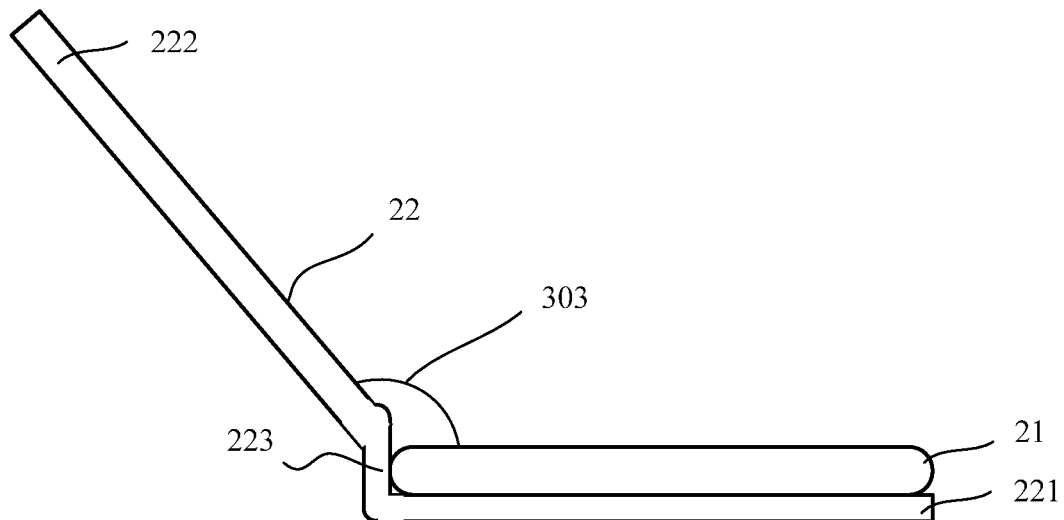
FIG. 3E is a cross-sectional schematic diagram of a protective case in an expanded state according to an embodiment of the present invention.

It may be understood that the protective case 22 may further include the expanded state. Referring to FIG. 3E, FIG. 3E is a cross-sectional schematic diagram of a protective case in an expanded state according to an embodiment of the present invention. In this case, a third included angle 303 is formed between the flip plate 222 of the protective case 22 and the plane that is of the terminal 21 fastened on the base plate 221 and that is away from the base plate 221, and the third included angle 303 is greater than the first angle threshold. In an embodiment of the present invention, the third included angle 303 is greater than the first angle threshold and less than a difference between 3600 and the second included angle.

When the protective case 22 is in the flip-up state, a magnetic field whose strength is not less than a first magnetic field strength and that is generated by the magnet passes through a working plane of the first Hall effect sensor from a first surface of the first Hall effect sensor, and the first Hall effect sensor outputs the first signal; and a magnetic field whose strength is not less than a second magnetic field strength and that is generated by the magnet passes through a working plane of the second Hall effect sensor from a first surface of the second Hall effect sensor, and the second Hall effect sensor outputs the second signal.

When the protective case 22 is in the flip-back state, the magnetic field whose strength is not less than the first magnetic field strength and that is generated by the magnet passes through the working plane of the first Hall effect sensor from a second surface of the first Hall effect sensor, and the first Hall effect sensor outputs the third signal; and the magnetic field whose strength is not less than the second magnetic field strength and that is generated by the magnet passes through the working plane of the second Hall effect sensor from a second surface of the second Hall effect sensor, and the second Hall effect sensor outputs the fourth signal.

When the protective case 22 is in the expanded state, a magnetic field whose strength is less than the first magnetic field strength and that is generated by the magnet passes through the working plane of the first Hall effect sensor from the first surface or the second surface of the first Hall effect sensor, and the first Hall effect sensor outputs a fifth signal; and a magnetic field whose strength is less than the second magnetic field strength and that is generated by the magnet passes through the working plane of the second Hall effect sensor from the first surface or the second surface of the second Hall effect sensor, and the second Hall effect sensor outputs a sixth signal. It may be understood that when the protective case 22 is in the expanded state, a strength of a magnetic field that acts on the first Hall effect sensor is less than the first magnetic field strength, and may also be 0; and a strength of a magnetic field that acts on the second Hall effect sensor is less than the second magnetic field strength, and may also be 0.

In an embodiment of the present invention, the first surface of the first Hall effect sensor and the second surface of the first Hall effect sensor may be a same surface of the first Hall effect sensor, and the surface is parallel to the working plane of the first Hall effect sensor. The first surface of the second Hall effect sensor and the second surface of the second Hall effect sensor may be a same surface of the second Hall effect sensor, and the surface is parallel to the working plane of the second Hall effect sensor.

In this case, the first signal is the same as the third signal, the first signal is different from the fifth signal, the second signal is the same as the fourth signal, and the second signal is different from the sixth signal.

In this case, a relative position relationship between the magnet and the Hall effect sensors may be: When the protective case is in the closed state, a connection line between a north pole and a south pole of the magnet is vertical to both the working plane of the first Hall effect sensor and the working plane of the second Hall effect sensor.

When it is detected that an output signal of the first Hall effect sensor changes into the first signal and an output signal of the second Hall effect sensor changes into the second signal, it indicates that the protective case 22 changes from the expanded state to the flip-up state or the flip-back state. In this case, the terminal 21 may perform a first operation such as a screen off operation.

When it is detected that the output signal of the first Hall effect sensor changes into the fifth signal and the output signal of the second Hall effect sensor changes into the sixth signal, it indicates that the protective case 22 changes into the expanded state. In this case, the terminal 21 may perform a third operation such as a screen wakeup operation.

It may be understood that a protective case manufacturer may not know a quantity of Hall effect sensors in the terminal, positions of the Hall effect sensors, or a terminal control method used by the terminal. If a single Hall effect sensor is used, a limitation to relative positions of the magnet and the Hall effect sensor is relatively low, and a position for which the Hall effect sensor can respond may be explored by using the magnet and a response status of the terminal, but the explored position is not an optimal position. Consequently, control of the protective case over the terminal may be insensitive, and therefore a user of the terminal mistakenly considers that the terminal has a poor capability of sensing the protective case. When the terminal control system includes two Hall effect sensors, a position of the magnet needs to meet response requirements for the two Hall effect sensors to implement control over the terminal. Therefore, to implement a terminal control function, a limitation to relative positions of the magnet and the Hall effect sensors is relatively high. In addition, the position of the magnet in the protective case that implements the terminal control function can be a better position, so as to improve sensitivity of control of the protective case over the terminal.

In an embodiment of the present invention, the first surface of the first Hall effect sensor and the second surface of the first Hall effect sensor are two opposite surfaces of the first Hall effect sensor, and both the first surface of the first Hall effect sensor and the second surface of the first Hall effect sensor are parallel to the working plane of the first Hall effect sensor; and the first surface of the second Hall effect sensor and the second surface of the second Hall effect sensor are two opposite surfaces of the second Hall effect sensor, and both the first surface of the second Hall effect sensor and the second surface of the second Hall effect sensor are parallel to the working plane of the Hall effect sensor. In this case, the first signal and third signal have opposite polarities, both the first signal and the third signal are different from the fifth signal, the second signal and the fourth signal have opposite polarities, and both the second signal and the fourth signal are different from the sixth signal. Therefore, a misoperation of the terminal is avoided, and user experience is improved.

In this case, a relative position relationship between the magnet and the Hall effect sensors may be: When the protective case is in the closed state, a connection line between a north pole and a south pole of the magnet is parallel to both the working plane of the first Hall effect sensor and the working plane of the second Hall effect sensor.

When it is detected that an output signal of the first Hall effect sensor changes into the first signal and an output signal of the second Hall effect sensor changes into the second signal, it indicates that the protective case 22 changes from the expanded state to the flip-up state. In this case, the terminal 21 may perform a first operation.

When it is detected that the output signal of the first Hall effect sensor changes into the third signal and the output signal of the second Hall effect sensor changes into the fourth signal, it indicates that the protective case 22 changes from the expanded state to the flip-back state. In this case, the terminal 21 may perform a second operation.

When it is detected that the output signal of the first Hall effect sensor changes from the first signal to the fifth signal and the output signal of the second Hall effect sensor changes from the second signal to the sixth signal, it indicates that the protective case 22 changes from the flip-up state to the expanded state. In this case, the terminal 21 may perform a third operation.

When it is detected that the output signal of the first Hall effect sensor changes from the third signal to the fifth signal and the output signal of the second Hall effect sensor changes from the fourth signal to the sixth signal, it indicates that the protective case 22 changes from the flip-back state to the expanded state. In this case, the terminal 21 may perform a fourth operation.

The first Hall effect sensor or the second Hall effect sensor may include at least one output end, an output signal of the output end is an electrical signal, and the electrical signal may be a voltage signal or a current signal.

Optionally, each of the first Hall effect sensor and the second Hall effect sensor includes two output ends, for example, the first output end and the second output end shown in FIG. 1, and output signals are voltage signals. A polarity of an output electrical signal of the first output end when the protective case 22 is in the flip-up state is opposite to that of an output electrical signal of the first output end when the protective case 22 is in the flip-back state. Likewise, a polarity of an output electrical signal of the second output end when the protective case 22 is in the flip-up state is opposite to that of an output electrical signal of the second output end when the protective case 22 is in the flip-back state.

For example, the first signal may mean that a first output end of the first Hall effect sensor outputs a high-level signal and a second output end of the first Hall effect sensor outputs a low-level signal, and the second signal may mean that a first output end of the second Hall effect sensor outputs a low-level signal and a second output end of the second Hall effect sensor outputs a high-level signal; the third signal may mean that the first output end of the first Hall effect sensor outputs a low-level signal and the second output end of the first Hall effect sensor outputs a high-level signal, and the fourth signal may mean that the first output end of the second Hall effect sensor outputs a high-level signal and the second output end of the second Hall effect sensor outputs a low-level signal; and the fifth signal may mean that both the first output end and the second output end of the first Hall effect sensor output high-level signals or low-level signals, and the sixth signal may mean that both the first output end and the second output end of the second Hall effect sensor output high-level signals or low-level signals.

It may be understood that a direction of a magnetic field that passes through the working plane of the first Hall effect sensor when the protective case 22 is in the closed state is different from a direction of a magnetic field that passes through the working plane of the first Hall effect sensor when the protective case 22 is in the flipped state. Therefore, the first Hall effect sensor outputs different electrical signals in the two states, and likewise, the second Hall effect sensor outputs different electrical signals in the two states. In this way, the following problem in the prior art can be avoided: Directions of a magnetic field that passes through a working plane of a Hall effect sensor are the same when the protective case 22 is in the closed state and the flipped state, and therefore, the Hall effect sensor outputs a same electrical signal, and the terminal 21 performs a screen locking operation regardless of whether the protective case 22 is in the closed state and the flipped state, causing a misoperation of the terminal 21 when the protective case 22 is in the flipped state.

In this embodiment of the present invention, the magnet may be a strip magnet, and through setting, the connection line between the north pole and the south pole of the magnet may be parallel to both the working plane of the first Hall effect sensor and the working plane of the second Hall effect sensor when the protective case 22 is in the closed state. Therefore, directions of a magnetic field that passes through a working plane of a Hall effect sensor are different when the protective case 22 is in the closed state and the flipped state. In this way, a misoperation of the terminal 21 is avoided, and the closed state and the flipped state of the protective case can be distinguished from each other, thereby implementing precise control over the terminal 21 and improving user experience.

It should be noted that the terminal 21 may include but is not limited to a mobile computer, a tablet computer, a mobile phone, a personal digital assistant (Personal Digital Assistant, PDA), a media player, and the like.

It may be understood that when the terminal control system includes one Hall effect sensor, positions of the Hall effect sensor and the magnet may be set, so that a working plane of the Hall effect sensor is parallel to the connection line between the north pole and the south pole of the magnet when the protective case is in the closed state, thereby avoiding a misoperation of the terminal that is caused by a position setting manner of a conventional protective case for a Hall effect sensor and a magnet. To be specific, a working plane of the Hall effect sensor is vertical to a connection line between a north pole and a south pole of the magnet when the conventional protective case is in a closed state, and when the conventional protective case is in the closed state and a flipped state, output signals of the Hall effect sensor that are detected by a terminal may be the same, and the terminal is triggered to perform a same operation such as a screen locking operation when the protective case performs a forward snap-fit operation (to be specific, a flip plate of the protective case covers the terminal on a base plate of the protective case) and a backward snap-fit operation (to be specific, the flip plate of the protective case is rotated to a back surface of the base plate of the protective case), causing a misoperation of the terminal when the protective case performs the backward snap-fit operation. In this embodiment of the present invention, through setting, a working plane of at least one Hall effect sensor is parallel to the connection line between the north pole and the south pole of the magnet, so that signals output by each of the two Hall effect sensors are inconsistent when the protective case is in the closed state and the flipped state, and a forward snap-fit operation and a backward snap-fit operation of the protective case are identified, thereby improving user experience.

However, the protective case manufacturer may not know a position of a Hall effect sensor in the terminal or a terminal control method used by the terminal, and the position of the Hall effect sensor may be explored by using the magnet and a response status of the terminal. When a conventional protective case is configured for the terminal, the terminal still responds to a forward snap-fit operation and a backward snap-fit operation of the protective case in a conventional manner. Consequently, the terminal performs a same operation in response to the forward snap-fit operation and the backward snap-fit operation of the protective case, and the user mistakenly considers that the terminal is faulty.

In the embodiment of the present invention, two Hall effect sensors are disposed, and when the protective case manufacturer does not know a terminal control method used by the terminal, positions of the Hall effect sensors can hardly be explored by using the magnet. In this case, the protective case manufacturer may make it more difficult to generate a protective case that matches the terminal, so that an unmatched protective case is prevented from being applied to the terminal, and the terminal responds only when a magnet setting manner meets output requirements of the terminal for both the first Hall effect sensor and the second Hall effect sensor. In this case, the magnet setting manner can fit the terminal control method, and a protective case produced in the magnet setting manner can match the terminal control method. In addition, the terminal for which the matched protective case is configured can identify a forward snap-fit operation and a backward snap-fit operation of the protective case, so as to avoid a misoperation of the terminal, implement precise control over the terminal, and improve user experience.

In an embodiment of the present invention, the first operation may include one of a screen locking operation, a sleep operation, and a screen off operation, the second operation may be no operation, and the third operation may be a screen wakeup operation. In this embodiment of the present invention, the following can be achieved: The terminal performs a sleep operation when detecting a forward snap-fit operation of the protective case; the terminal performs a screen wakeup operation when detecting an operation of opening the protective case; and the terminal may perform no operation when detecting a backward snap-fit operation of the protective case. It should be noted that alternatively, the first operation, the second operation, and the third operation may be other operations, and this is not limited in the present invention.

Positions of a Hall effect sensor and a magnet may be set in the following manners:

First setting manner for a Hall effect sensor and a magnet: The magnet is disposed in the flip plate 222, and the first Hall effect sensor and the second Hall effect sensor are disposed in the terminal 21.

Second setting manner for a Hall effect sensor and a magnet: The magnet is disposed in the flip plate 222, and the first Hall effect sensor and the second Hall effect sensor are disposed in the base plate 221.

Third setting manner for a Hall effect sensor and a magnet: The magnet is disposed in the flip plate 222, the first Hall effect sensor is disposed in the base plate 221, and the second Hall effect sensor is disposed in the terminal 21.

Fourth setting manner for a Hall effect sensor and a magnet: The first Hall effect sensor and the second Hall effect sensor are disposed in the flip plate 222, and the magnet is disposed in the terminal 21.

Fifth setting manner for a Hall effect sensor and a magnet: The first Hall effect sensor and the second Hall effect sensor are disposed in the flip plate 222, and the magnet is disposed in the base plate 221.

Optionally, there may be one magnet, and the magnet is disposed between the first Hall effect sensor and the second Hall effect sensor when the protective case is in the closed state; or there may be two magnets including a first magnet and a second magnet, the first magnet mainly acts on the first Hall effect sensor, and the second Hall effect sensor mainly acts on the second Hall effect sensor.

It should be noted that a distance between the first Hall effect sensor and the second Hall effect sensor may be 10 mm to 50 mm, and a length of the magnet may be 5 mm to 40 mm. For example, the distance between the first Hall effect sensor and the second Hall effect sensor may be 20 mm, and the length of the magnet is 10 mm.

The following describes a relative position relationship between the magnet, the first Hall effect sensor, and the second Hall effect sensor by using the first setting manner for a Hall effect sensor and a magnet as an example.

In an embodiment of the present invention, when the protective case is in the closed state, the connection line between the north pole of the magnet and the south pole of the magnet may be vertical to the working plane of the first Hall effect sensor and/or the working plane of the second Hall effect sensor.

Figure 4A:
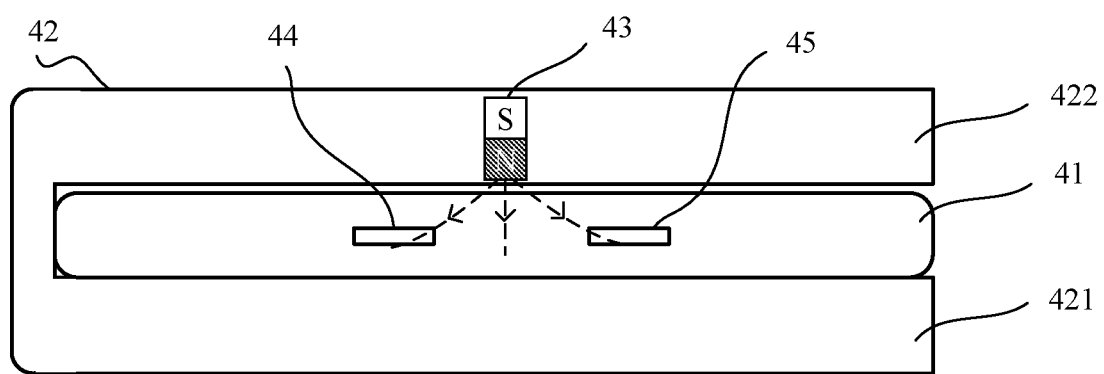
FIG. 4A is an illustrative schematic diagram of a first position relationship between a magnet and a Hall effect sensor according to an embodiment of the present invention.
Figure 4B:
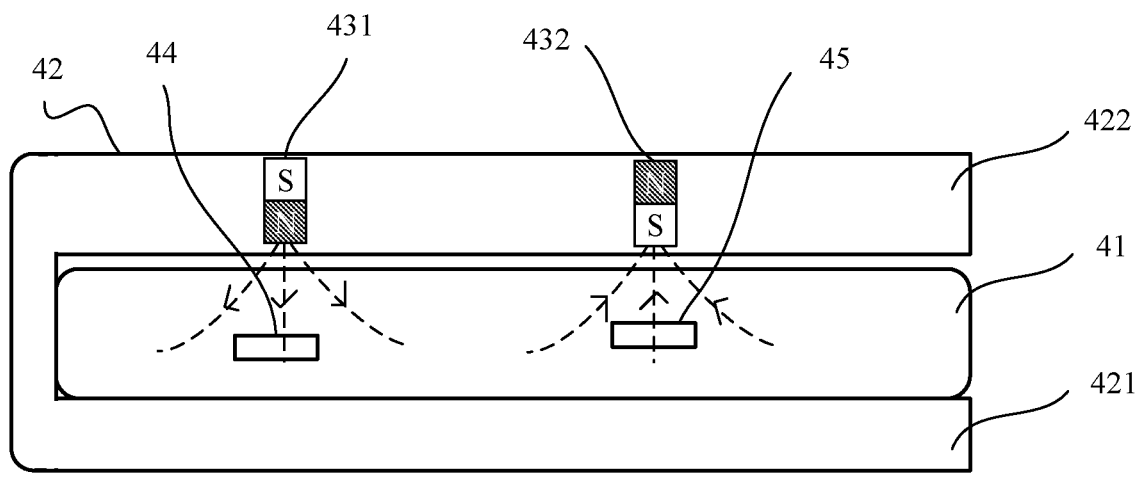
FIG. 4B is an illustrative schematic diagram of a second position relationship between a magnet and a Hall effect sensor according to an embodiment of the present invention.

Referring to FIG. 4A, and FIG. 4B, FIG. 4A is an illustrative schematic diagram of a first position relationship between a magnet and a Hall effect sensor according to an embodiment of the present invention, and FIG. 4B is an illustrative schematic diagram of a second position relationship between a magnet and a Hall effect sensor according to an embodiment of the present invention. FIG. 4A and FIG. 4B are cross-sectional diagrams of a terminal control system when a protective case 42 is in a closed state.

As shown in FIG. 4A, a magnet 43 is disposed in a flip plate 422 of the protective case 42, a connection line between a north pole and a south pole of the magnet 43 may be vertical to a plane on which the flip plate 422 is located, and both a working plane of a first Hall effect sensor 44 and a working plane of a second Hall effect sensor 45 may be parallel to a plane on which a terminal 41 is located.

As shown in FIG. 4B, a magnet includes a first magnet 431 and a second magnet 432, both a connection line between a north pole and a south pole of the first magnet 431 and a connection line between a north pole and a south pole of the second magnet 432 may be vertical to the plane on which the flip plate 422 is located, and both the working plane of the first Hall effect sensor 44 and the working plane of the second Hall effect sensor 45 may be vertical to the plane on which the terminal 41 is located.

In an embodiment of the present invention, when the protective case is in the closed state, the connection line between the north pole of the magnet and the south pole of the magnet may be parallel to the working plane of the first Hall effect sensor and/or the working plane of the second Hall effect sensor.

Optionally, the connection line between the north pole of the magnet and the south pole of the magnet may be parallel to the plane on which the flip plate is located. When the protective case is in the closed state, the plane on which the flip plate is located is parallel to the plane on which the base plate is located and the plane on which the terminal is located, and the working plane of the first Hall effect sensor and the working plane of the second Hall effect sensor may be parallel to the plane on which the flip plate is located. A distance between the first Hall effect sensor and a projection of the magnet onto the plane on which the terminal is located is greater than a first distance threshold, and a distance between the second Hall effect sensor and a projection of the magnet onto the plane on which the terminal is located is greater than a second distance threshold. The first distance threshold is a minimum distance between the projection of the magnet onto the plane on which the terminal is located and the first Hall effect sensor when the Hall effect sensor can output the first signal and the third signal. The second distance threshold is a minimum distance between the projection of the magnet onto the plane on which the terminal is located and the second Hall effect sensor when the Hall effect sensor can output the second signal and the fourth signal. The first distance threshold or the second distance threshold is usually greater than 0. The first distance threshold or the second distance threshold is related to distribution of magnetic field strengths of the magnet and a parameter of the Hall effect sensor, for example, a Hall coefficient of a material, a thickness of the material, and intensity of a current. Optionally, due to the first distance threshold or the second distance threshold, a value of a strength of a magnetic field that passes through a working plane of a Hall effect sensor can be not less than 0.8 mT to 3.4 mT when the protective case is in the closed state or the flipped state.

Figure 4C:
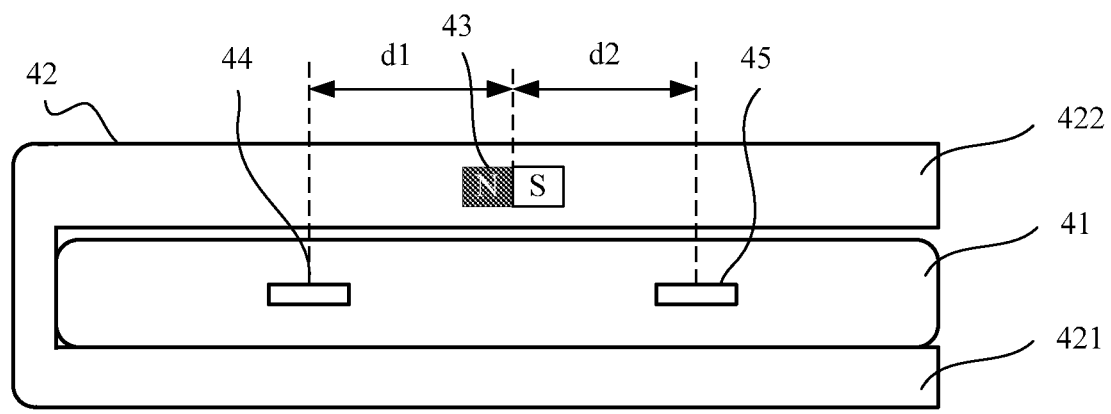
FIG. 4C is a first illustrative schematic diagram of a first position relationship between a magnet and a Hall effect sensor according to an embodiment of the present invention.
Figure 4D:
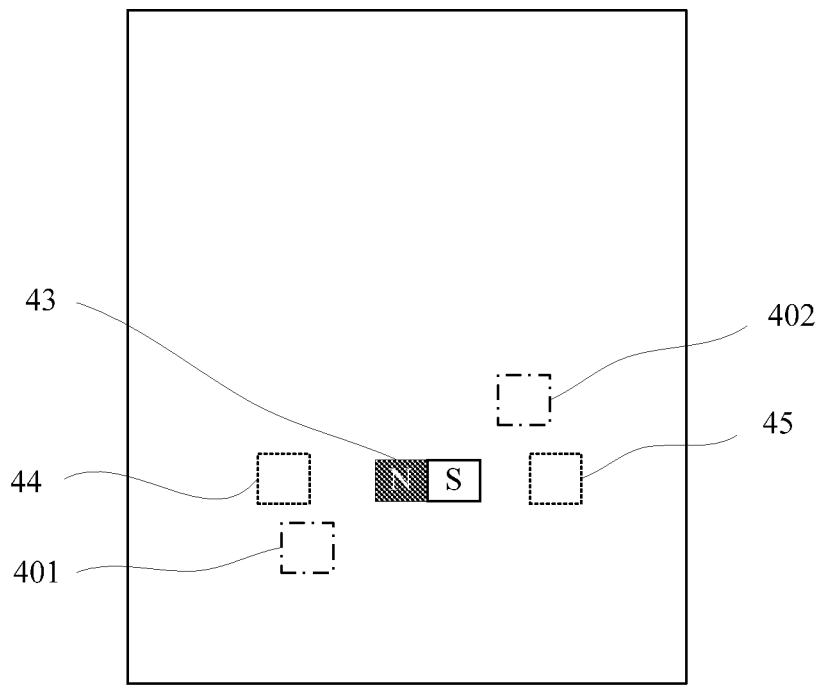
FIG. 4D is a second illustrative schematic diagram of a first position relationship between a magnet and a Hall effect sensor according to an embodiment of the present invention.

Referring to FIG. 4C and FIG. 4D, FIG. 4C is a first illustrative schematic diagram of a first position relationship between a magnet and a Hall effect sensor according to an embodiment of the present invention, and FIG. 4D is a second illustrative schematic diagram of a first position relationship between a magnet and a Hall effect sensor according to an embodiment of the present invention. FIG. 4C is a cross-sectional diagram of the terminal control system when the protective case 42 is in the closed state, and FIG. 4D is a top view of the terminal control system when the protective case 42 is in the closed state. The magnet 43 is disposed in the flip plate 422, and the connection line between the north pole of the magnet 43 and the south pole of the magnet 43 may be parallel to the plane on which the flip plate 422 is located. The first Hall effect sensor 44 and the second Hall effect sensor 45 are disposed in the terminal 41, and both the working plane of the first Hall effect sensor and the working plane of the second Hall effect sensor are parallel to a plane on which a base plate 421 is located. A distance d1 between the first Hall effect sensor and a projection of the magnet onto the plane on which the flip plate 422 is located is greater than the first distance threshold, and a distance d2 between the second Hall effect sensor and a projection of the magnet onto the plane on which the flip plate 422 is located is greater than the second distance threshold.

Optionally, the connection line between the north pole of the magnet and the south pole of the magnet may be vertical to the plane on which the flip plate is located. When the protective case is in the closed state, the plane on which the flip plate is located is parallel to the plane on which the base plate is located and the plane on which the terminal is located. The working plane of the first Hall effect sensor and the working plane of the second Hall effect sensor may be vertical to the plane on which the flip plate is located. A distance between the first Hall effect sensor and a projection of the magnet onto the plane on which the terminal is located is greater than a third distance threshold, and a distance between the second Hall effect sensor and a projection of the magnet onto the plane on which the terminal is located is greater than a fourth distance threshold. The third distance threshold is a minimum distance between the projection of the magnet onto the plane on which the terminal is located and the first Hall effect sensor when the Hall effect sensor can output the first signal and the third signal. The fourth distance threshold is a minimum distance between the projection of the magnet onto the plane on which the terminal is located and the second Hall effect sensor when the Hall effect sensor can output the second signal and the fourth signal. The third distance threshold or the fourth distance threshold is usually greater than 0. The third distance threshold or the fourth distance threshold is related to distribution of magnetic field strengths of the magnet and a parameter of the Hall effect sensor, for example, a Hall coefficient of a material, a thickness of the material, and intensity of a current. Optionally, due to the third distance threshold or the fourth distance threshold, a value of a strength of a magnetic field that passes through a working plane of a Hall effect sensor can be not less than 0.8 mT to 3.4 mT when the protective case is in the closed state or the flipped state.

Figure 5A:
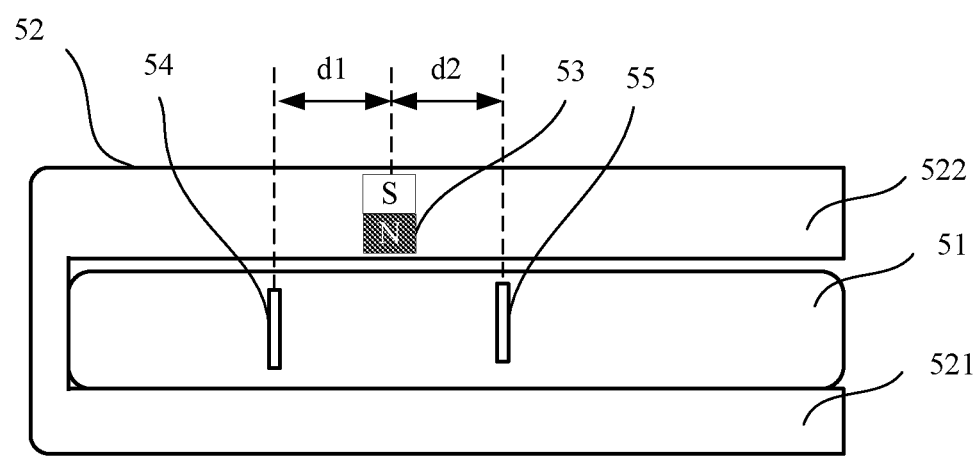
FIG. 5A is a first illustrative schematic diagram of a second position relationship between a magnet and a Hall effect sensor according to an embodiment of the present invention.
Figure 5B:
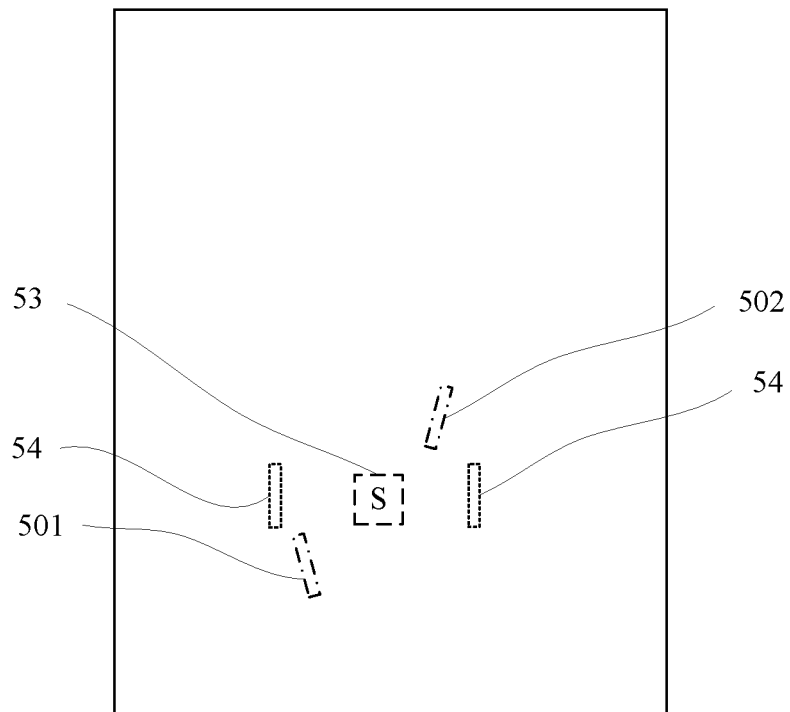
FIG. 5B is a second illustrative schematic diagram of a second position relationship between a magnet and a Hall effect sensor according to an embodiment of the present invention.

Referring to FIG. 5A and FIG. 5B, FIG. 5A is a first illustrative schematic diagram of a second position relationship between a magnet and a Hall effect sensor according to an embodiment of the present invention, and FIG. 5B is a second illustrative schematic diagram of a second position relationship between a magnet and a Hall effect sensor according to an embodiment of the present invention. FIG. 5A is a cross-sectional diagram when a protective case 52 is in a closed state, and FIG. 5B is a top view when the protective case 52 is in the closed state. A magnet 53 is disposed in a flip plate 522, and a connection line between a north pole of the magnet 53 and a south pole of the magnet 53 may be vertical to a plane on which the flip plate 522 is located. A first Hall effect sensor and a second Hall effect sensor are disposed in a terminal 51, and both a working plane of the first Hall effect sensor and a working plane of the second Hall effect sensor are vertical to a plane on which a base plate 521 is located. A distance d3 between the first Hall effect sensor and a projection of the magnet onto a plane on which the terminal 51 is located is greater than a third distance threshold, and a distance d4 between the second Hall effect sensor and a projection of the magnet onto the plane on which the terminal 51 is located is greater than a fourth distance threshold.

It should be noted that, when the first Hall effect sensor can output the first signal and the third signal and the second Hall effect sensor can output the second signal and the fourth signal, an angle may be formed between the working plane of the first Hall effect sensor and/or the working plane of the second Hall effect sensor and the plane on which the terminal is located, and/or an angle is formed between the connection line between the north pole of the magnet and the south pole of the magnet and the plane on which the flip plate is located, so that when the protective case is in the closed state, an angle is formed between the working plane of the first Hall effect sensor and/or the working plane of the second Hall effect sensor and the connection line between the north pole of the magnet and the south pole of the magnet.

For example, a relative position relationship between the magnet, the first Hall effect sensor, and the second Hall effect sensor may be that between the magnet 43, the first Hall effect sensor 401, and the second Hall effect sensor 402 shown in FIG. 4B, and is not limited in the present invention.

For another example, a relative position relationship between the magnet, the first Hall effect sensor, and the second Hall effect sensor may be that between the magnet 53, the first Hall effect sensor 501, and the second Hall effect sensor 502 shown in FIG. 5B, and is not limited in the present invention.

Figure 6:
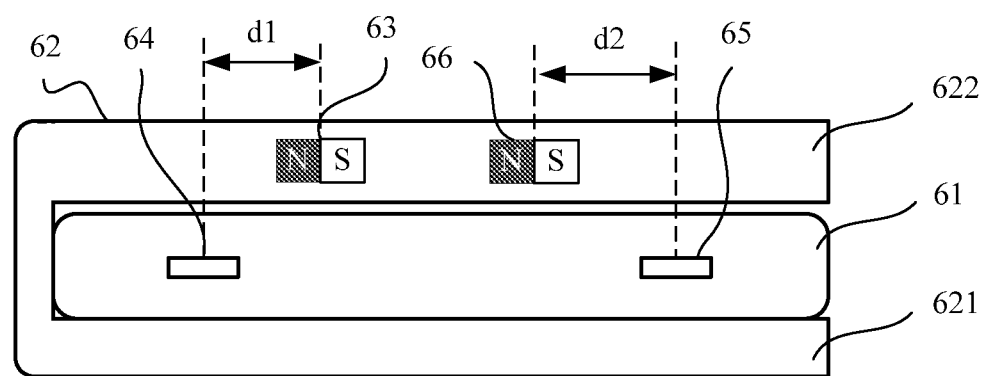
FIG. 6 is a first illustrative schematic diagram of a position relationship between two magnets and two Hall effect sensors according to an embodiment of the present invention.

In an embodiment of the present invention, the terminal or the protective case may further include a plurality of magnets, and the plurality of magnets jointly or separately act on the first Hall effect sensor and the second Hall effect sensor. Referring to FIG. 6, FIG. 6 is a first illustrative schematic diagram of a position relationship between two magnets and two Hall effect sensors according to an embodiment of the present invention.

In FIG. 6, one magnet is added on the basis of FIG. 4A. A first magnet 63 and a second magnet 66 are disposed in a flip plate 622, and a connection line between a north pole of the first magnet 63 and a south pole of the first magnet 63 and a connection line between a north pole of the second magnet 66 and a south pole of the second magnet 66 may be parallel to a plane on which the flip plate 622 is located. A first Hall effect sensor 64 and a second Hall effect sensor 65 are disposed in a terminal 61, and both a working plane of the first Hall effect sensor 64 and a working plane of the second Hall effect sensor 65 are parallel to a plane on which a base plate 621 is located. The first magnet 63 mainly acts on the first Hall effect sensor 64, and the second magnet 66 mainly acts on the second Hall effect sensor 65. A distance d1 between the first Hall effect sensor and a projection of the first magnet 63 onto the plane on which the flip plate 622 is located is greater than a first distance threshold, and a distance d2 between the second Hall effect sensor 66 and a projection of the second magnet 66 onto the plane on which the flip plate 622 is located is greater than a second distance threshold.

Figure 7:
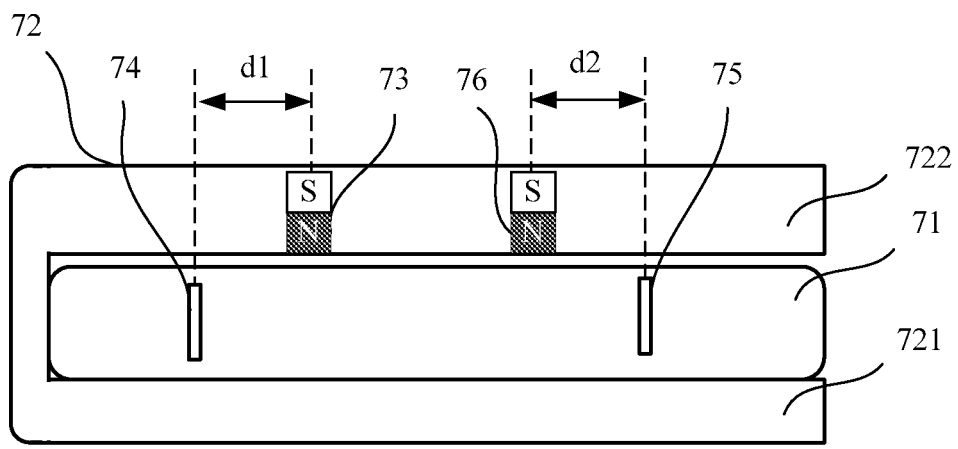
FIG. 7 is a second illustrative schematic diagram of a position relationship between two magnets and two Hall effect sensors according to an embodiment of the present invention.

Referring to FIG. 7, FIG. 7 is a second illustrative schematic diagram of a position relationship between two magnets and two Hall effect sensors according to an embodiment of the present invention. In FIG. 7, one magnet is added on the basis of FIG. 5A. A connection line between a north pole of a first magnet 73 and a south pole of the first magnet 73 may be vertical to a plane on which a flip plate 722 is located, and a connection line between a north pole of a second magnet 76 and a south pole of the second magnet 76 may be vertical to the plane on which the flip plate 722 is located. When a protective case 72 is in a closed state, the plane on which the flip plate 722 is located is parallel to a plane on which a base plate 721 is located and a plane on which a terminal 71 is located.

The first magnet 73 and the second magnet 76 are disposed in the flip plate 722, and both the connection line between the north pole of the first magnet 73 and the south pole of the first magnet 73 and the connection line between the north pole of the second magnet 76 and the south pole of the second magnet 76 may be vertical to the plane on which the flip plate 722 is located. A first Hall effect sensor 74 and a second Hall effect sensor 75 are disposed in the terminal 71, and both a working plane of the first Hall effect sensor 74 and a working plane of the second Hall effect sensor 75 are vertical to the plane on which the base plate 721 is located. The first magnet 73 mainly acts on the first Hall effect sensor 74, and the second magnet 76 mainly acts on the second Hall effect sensor 75. A distance d3 between the first Hall effect sensor 74 and a projection of the first magnet 73 onto the plane on which the flip plate 722 is located is greater than a third distance threshold, and a distance d4 between the second Hall effect sensor 75 and a projection of the second magnet 76 onto the plane on which the flip plate 722 is located is greater than a fourth distance threshold. For descriptions of the third distance threshold or the fourth distance threshold, refer to the related descriptions in the foregoing embodiment. Details are not described again in the present invention.

It should be noted that for descriptions of the first distance threshold or the second distance threshold, refer to the related descriptions in the foregoing embodiment. Details are not described again in the present invention.

It should be further noted that, when the first Hall effect sensor can output the first signal and the third signal and the second Hall effect sensor can output the second signal and the fourth signal, a relative position relationship between the first magnet, the second magnet, the first Hall effect sensor, and the second Hall effect sensor may have another form. For example, when the protective case is in the closed state, an angle is formed between the working plane of the first Hall effect sensor and a connection line between a north pole and a south pole of the first magnet, and/or an angle is formed between the working plane of the second Hall effect sensor and a connection line between a north pole and a south pole of the second magnet.

It should be further noted that, in any other setting manner for a Hall effect sensor and a magnet, for the relative position relationship between the magnet, the first Hall effect sensor, and the second Hall effect sensor, refer to any setting manner for the relative position relationship in FIG. 4C, FIG. 4D, FIG. 5A, FIG. 5B, FIG. 6, and FIG. 7, and details are not described again in the present invention.

The following describes a principle of a terminal control method by using, as an example, a relative position relationship between the magnet, the first Hall effect sensor, and the second Hall effect sensor shown in FIG. 4C in the first setting manner for a Hall effect sensor and a magnet.

Figure 8A:
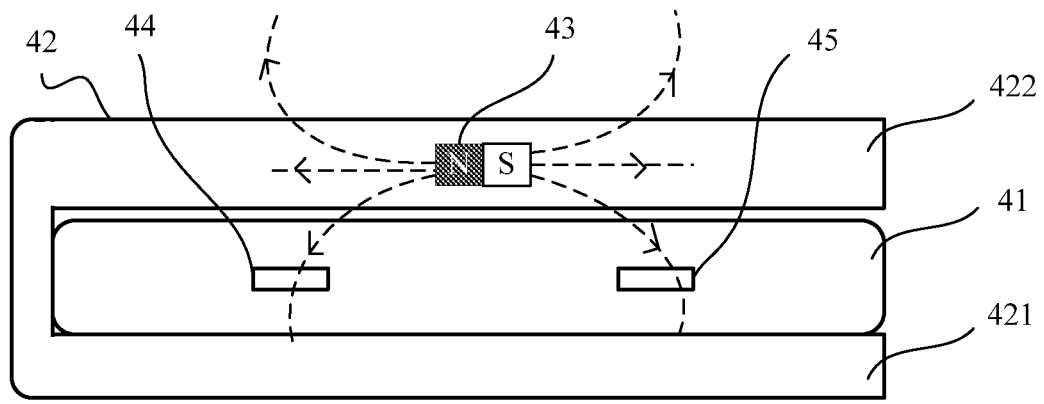
FIG. 8A is a cross-sectional schematic diagram of a first structure of a terminal control system when a protective case is in a closed state according to an embodiment of the present invention.
Figure 8B:
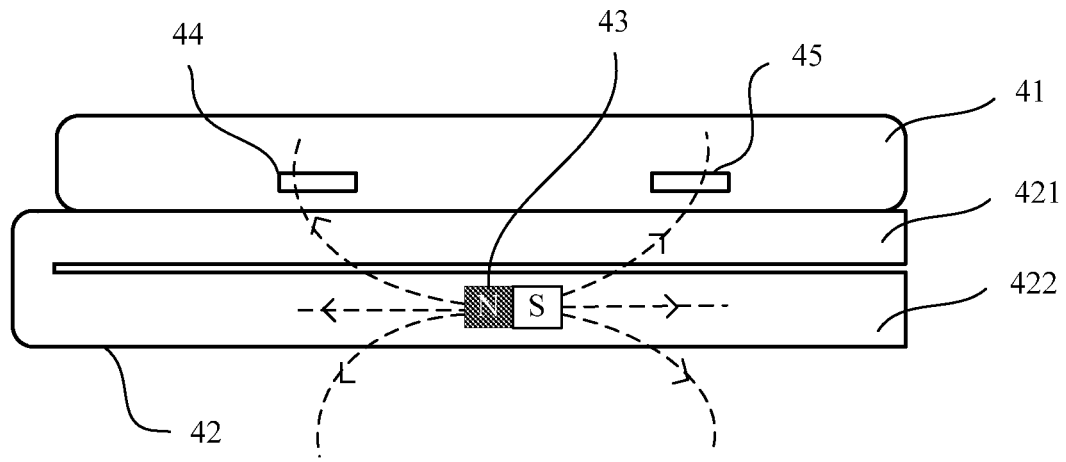
FIG. 8B is a cross-sectional schematic diagram of a second structure of a terminal control system when a protective case is in a flipped state according to an embodiment of the present invention.

Referring to FIG. 8A and FIG. 8B, FIG. 8A is a cross-sectional schematic diagram of a first structure of a terminal control system when a protective case is in a closed state according to an embodiment of the present invention, and FIG. 8B is a cross-sectional schematic diagram of a second structure of a terminal control system when a protective case is in a flipped state according to an embodiment of the present invention.

When the protective case 42 is in a flip-up state, a magnetic field whose strength is not less than a first magnetic field strength and that is generated by the magnet 43 passes through the working plane of the first Hall effect sensor 44 from an upper surface of the first Hall effect sensor 44, a north-pole interrupt occurs in the first Hall effect sensor 44, and the first Hall effect sensor 44 outputs a first signal such as a high-level signal; and a magnetic field whose strength is not less than a second magnetic field strength and that is generated by the magnet 43 passes through the working plane of the second Hall effect sensor 45 from an upper surface of the second Hall effect sensor 45, a south-pole interrupt occurs in the second Hall effect sensor 45, and the second Hall effect sensor 45 outputs a second signal such as a low-level signal.

When the protective case 42 is in a flip-back state, the magnetic field whose strength is not less than the first magnetic field strength and that is generated by the magnet 43 passes through the working plane of the first Hall effect sensor 44 from a second surface of the first Hall effect sensor 44, and the first Hall effect sensor 44 outputs a third signal; and the magnetic field whose strength is not less than the second magnetic field strength and that is generated by the magnet 43 passes through the working plane of the second Hall effect sensor 45 from a second surface of the second Hall effect sensor 45, and the second Hall effect sensor 45 outputs a fourth signal.

When it is detected that an output signal of the first Hall effect sensor 44 changes into the first signal and an output signal of the second Hall effect sensor 45 changes into the second signal, it indicates that the protective case 42 changes from an expanded state to the flip-up state. In this case, the terminal 41 may perform a first operation.

When it is detected that the output signal of the first Hall effect sensor 44 changes into the third signal and the output signal of the second Hall effect sensor 45 changes into the fourth signal, it indicates that the protective case 42 changes from the expanded state to the flip-back state. In this case, the terminal 41 may perform a second operation.

The following describes a principle of a terminal control method by using, as an example, a relative position relationship between the first magnet, the second magnet, the first Hall effect sensor, and the second Hall effect sensor shown in FIG. 6 in the first setting manner for a Hall effect sensor and a magnet.

Figure 9A:
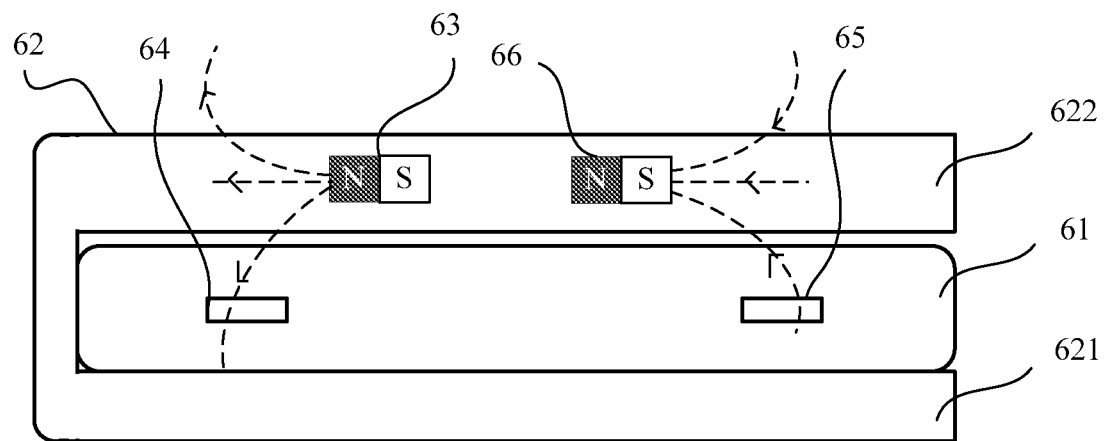
FIG. 9A is a cross-sectional schematic diagram of a third structure of a terminal control system when a protective case is in a closed state according to an embodiment of the present invention.
Figure 9B:
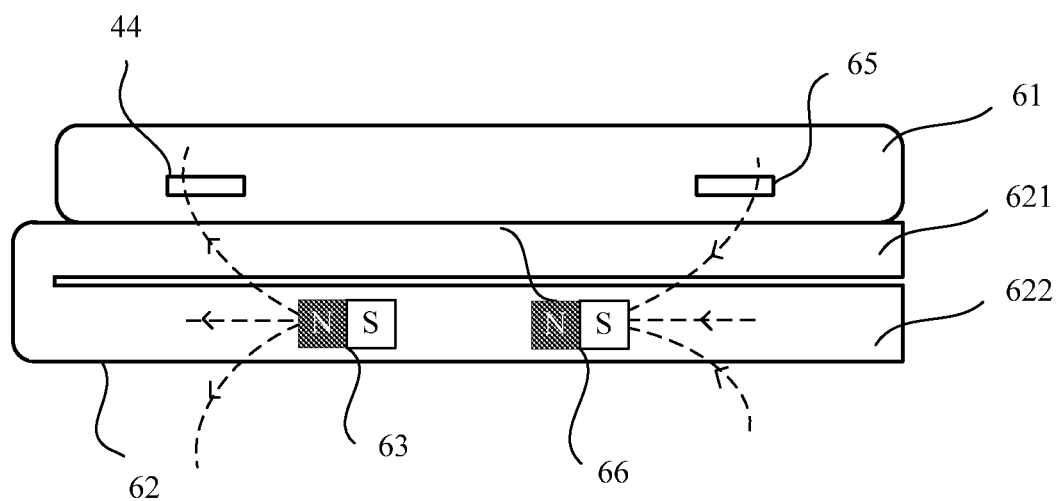
FIG. 9B is a cross-sectional schematic diagram of a fourth structure of a terminal control system when a protective case is in a flipped state according to an embodiment of the present invention.

Referring to FIG. 9A and FIG. 9B, FIG. 9A is a cross-sectional schematic diagram of a third structure of a terminal control system when a protective case is in a closed state according to an embodiment of the present invention, and FIG. 9B is a cross-sectional schematic diagram of a fourth structure of a terminal control system when a protective case is in a flipped state according to an embodiment of the present invention.

When the protective case 62 is in a flip-up state, a magnetic field whose strength is not less than a first magnetic field strength and that is generated by the first magnet 63 passes through the working plane of the first Hall effect sensor 64 from an upper surface of the first Hall effect sensor 64, a north-pole interrupt occurs in the first Hall effect sensor 64, and the first Hall effect sensor 64 outputs a first signal such as a high-level signal; and a magnetic field whose strength is not less than a second magnetic field strength and that is generated by the second magnet 66 passes through the working plane of the second Hall effect sensor 65 from an upper surface of the second Hall effect sensor 65, a north-pole interrupt occurs in the second Hall effect sensor 65, and the second Hall effect sensor 65 outputs a second signal such as a high-level signal.

When the protective case 62 is in a flip-back state, the magnetic field whose strength is not less than the first magnetic field strength and that is generated by the first magnet 63 passes through the working plane of the first Hall effect sensor 64 from a second surface of the first Hall effect sensor 64, and the first Hall effect sensor 64 outputs a third signal; and the magnetic field whose strength is not less than the second magnetic field strength and that is generated by the second magnet 66 passes through the working plane of the second Hall effect sensor 65 from a second surface of the second Hall effect sensor 65, and the second Hall effect sensor 65 outputs a fourth signal.

When it is detected that an output signal of the first Hall effect sensor 64 changes into the first signal and an output signal of the second Hall effect sensor 65 changes into the second signal, it indicates that the protective case 62 changes from an expanded state to the flip-up state. In this case, the terminal 61 may perform a first operation.

When it is detected that the output signal of the first Hall effect sensor 64 changes into the third signal and the output signal of the second Hall effect sensor 65 changes into the fourth signal, it indicates that the protective case 62 changes from the expanded state to the flip-back state. In this case, the terminal 61 may perform a second operation.

The following describes a terminal in an embodiment of the present invention.

Figure 10:
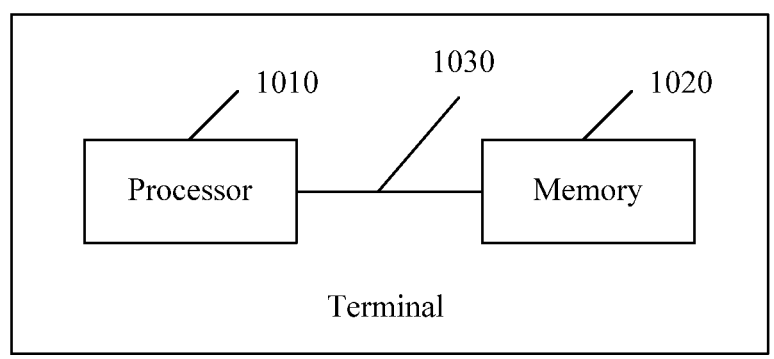
FIG. 10 is a schematic structural diagram of a first terminal according to an embodiment of the present invention.

The terminal may include a processor and a memory. Referring to FIG. 10, FIG. 10 is a schematic structural diagram of a first terminal according to an embodiment of the present invention. A processor 1010 is connected to a memory 1020 by using a bus 1030. The memory 1020 is configured to store data and program code, and the processor 1010 is configured to invoke the data and the program code stored in the memory 1020 to perform the following step:

performing a target operation in response to an operation of detecting that an output signal of a first Hall effect sensor changes and an output signal of a second Hall effect sensor changes.

Optionally, that the processor performs a target operation in response to an operation of detecting that an output signal of a first Hall effect sensor changes and an output signal of a second Hall effect sensor changes specifically includes at least one of the following steps:

performing a first operation in response to an operation of detecting that the output signal of the first Hall effect sensor changes into a first signal and the output signal of the second Hall effect sensor changes into a second signal;

performing a second operation in response to an operation of detecting that the output signal of the first Hall effect sensor changes into a third signal and the output signal of the second Hall effect sensor changes into a fourth signal; and performing a third operation in response to an operation of detecting that the output signal of the first Hall effect sensor changes into a fifth signal and the output signal of the second Hall effect sensor changes into a sixth signal.

Figure 11:
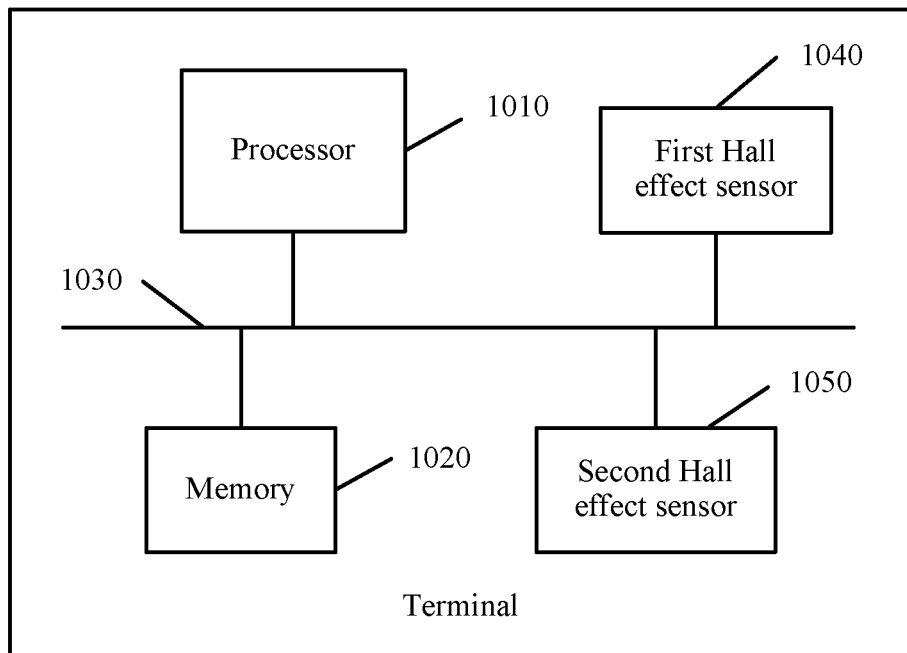
FIG. 11 is a schematic structural diagram of a second terminal according to an embodiment of the present invention.

For the first setting manner for a Hall effect sensor and a magnet, referring to FIG. 11, FIG. 11 is a schematic structural diagram of a second terminal according to an embodiment of the present invention. The terminal further includes a first Hall effect sensor 1040 and a second Hall effect sensor 1050, and the processor 1010 is connected to the first Hall effect sensor 1040 and the second Hall effect sensor 1050 by using the bus 1030.

Figure 12:
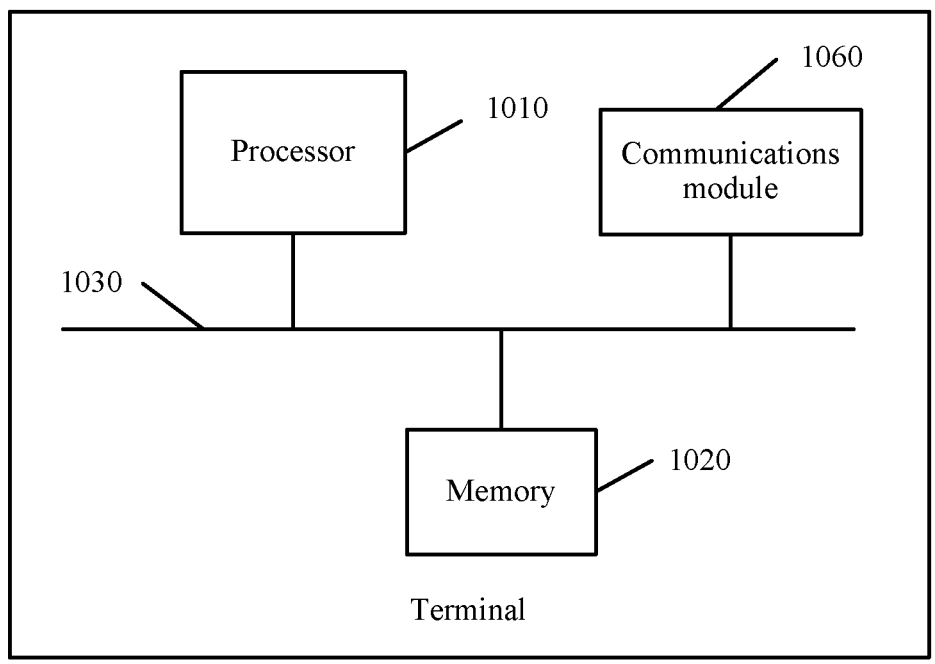
FIG. 12 is a schematic structural diagram of a third terminal according to an embodiment of the present invention.

For the second, third, fourth, or fifth setting manner for a Hall effect sensor and a magnet, the terminal includes a communications module in addition to the processor 1010 and the memory 1020 of the terminal in FIG. 10. Referring to FIG. 12, FIG. 12 is a schematic structural diagram of a third terminal according to an embodiment of the present invention. The processor 1010 is connected to a communications module 1060 by using the bus 1030. The communications module 1060 is configured to establish a communication connection to a communication peer end (for example, a protective case), to implement information exchange with the communication peer end. For the third setting manner for a Hall effect sensor and a magnet, the terminal further includes a second sensor.

The processor 1010 is further configured to receive an operation indication instruction sent by the protective case, where the operation indication instruction is an instruction that is generated by the protective case based on a change of the output signal of the first Hall effect sensor and a change of the output signal of the second Hall effect sensor and that is sent to the terminal, and is used to instruct the terminal to perform the target operation.

It may be understood that the operation indication instruction may include at least one of a first operation indication instruction, a second operation indication instruction, a third operation indication instruction, and the like. The first operation indication instruction is generated by the protective case based on the first signal and the second signal, and is used to instruct the terminal to perform the first operation, the second operation indication instruction is generated by the protective case based on the third signal and the fourth signal, and is used to instruct the terminal to perform the second operation, and the third operation indication instruction is generated by the protective case based on the fifth signal and the sixth signal, and is used to instruct the terminal to perform the third operation.

For descriptions of a structure of the protective case, the first signal, the second signal, the third signal, the fourth signal, a relative position relationship between the first Hall effect sensor, the second Hall effect sensor, and a magnet, and the like, refer to the related descriptions in the foregoing embodiment. Details are not described again in the present invention. Corresponding to each setting manner for a Hall effect sensor and a magnet, the terminal may further include a magnet.

The memory 1020 may be configured to store a computer program and a module, and the memory 1020 may include a high-speed random access memory, or may include a non-volatile memory such as at least one magnetic disk storage device, a flash memory device, or another volatile solid-state storage device. Correspondingly, the memory 1020 may further include a memory controller, to provide access for the processor 1010.

The communications module 1060 is configured to establish a communication channel, so that the terminal is connected to the communication peer end by using the communication channel, and exchanges data with the communication peer end by using the communication channel. The communications module 1060 may include a Bluetooth (Bluetooth) module, an NFC (Near Field Communication) module, a WiFi (Wireless Fidelity) module, and the like.

The processor 1010 is a control center of the terminal, is connected to all parts of the entire terminal by using various interfaces and lines, and performs various functions of the terminal and data processing by running or executing the computer program and/or the module stored in the memory 1020 and invoking the data stored in the memory 1020, so as to perform overall monitoring on the terminal. Optionally, the processor 1010 may include one or more processing cores. Preferably, an application processor and a modem processor may be integrated into the processor 1010. The application processor mainly processes an operating system, a user interface, an application program, and the like, and the modem processor mainly processes wireless communication. It may be understood that alternatively, the modem processor may not be integrated into the processor 1010.

It may be understood that, based on a setting manner for a Hall effect sensor and a magnet, the terminal may further include a magnet. Optionally, the magnet may include a plurality of strip magnets such as a first magnet and a second magnet.

It should be noted that for implementation of each instruction in this embodiment of the present invention, refer to the related descriptions in the method embodiment, and details are not described again in the present invention.

The following describes a protective case in an embodiment of the present invention.

For the first setting manner for a Hall effect sensor and a magnet, the protective case is a protective case that matches a terminal, and performs a terminal control method in cooperation with the terminal. For a structure of the protective case, refer to the protective case shown in FIG. 4A, FIG. 4B, FIG. 4C, FIG. 5A, or FIG. 7. Details are not described again in the present invention.

Figure 13:
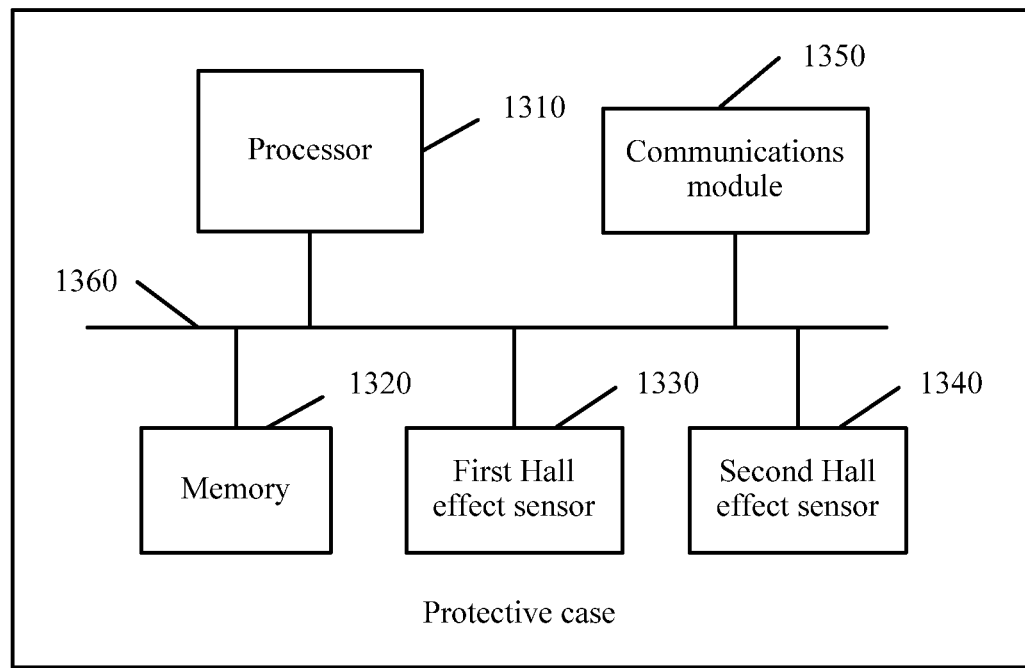
FIG. 13 is a schematic structural diagram of a protective case according to an embodiment of the present invention.

For the second, third, fourth, or fifth setting manner for a Hall effect sensor and a magnet, referring to FIG. 13, FIG. 13 is a schematic structural diagram of a protective case according to an embodiment of the present invention. The protective case may include a processor 1310, a memory 1320, a first Hall effect sensor 1330, a second Hall effect sensor 1340, and a communications module 1350. The processor 1310 is connected to the memory 1320, the first Hall effect sensor 1330, the second Hall effect sensor 1340, and the communications module 1350 by using a bus 1360.

The processor 1310 is configured to invoke data and program code stored in the memory to perform the following step:

sending, by using the communications module, an operation indication instruction to a terminal in response to an operation of detecting that an output signal of the first Hall effect sensor changes and an output signal of the second Hall effect sensor changes, where the operation indication instruction is generated by the protective case based on a change of the output signal of the first Hall effect sensor and a change of the output signal of the second Hall effect sensor, and is used to instruct the terminal to perform a target operation.

It may be understood that the operation indication instruction may include at least one of a first operation indication instruction, a second operation indication instruction, a third operation indication instruction, and the like.

For descriptions of a structure of the protective case, a first signal, a second signal, a third signal, a fourth signal, a relative position relationship between the first Hall effect sensor, the second Hall effect sensor, and a magnet, the first operation indication instruction, the second operation indication instruction, the third operation indication instruction, and the like, refer to the related descriptions in the foregoing embodiment. Details are not described again in the present invention. Corresponding to each setting manner for a Hall effect sensor and a magnet, the protective case may further include a magnet.

The memory 1320 may be configured to store a computer program and a module, and the memory 1320 may include a high-speed random access memory, or may include a non-volatile memory such as at least one magnetic disk storage device, a flash memory device, or another volatile solid-state storage device. Correspondingly, the memory 1320 may further include a memory controller, to provide access for the processor 1310.

The communications module 1350 is configured to establish a communication channel, so that the protective case is connected to a communication peer end by using the communication channel, and exchanges data with the communication peer end by using the communication channel. The communications module 1350 may include a Bluetooth (Bluetooth) module, an NFC (Near Field Communication) module, a WiFi (Wireless Fidelity) module, and the like.

The processor 1310 is a control center of the protective case, is connected to all parts of the entire protective case by using various interfaces and lines, and performs various functions of the protective case and data processing by running or executing the computer program and/or the module stored in the memory 1320 and invoking data stored in the memory 1320, so as to perform overall monitoring on the protective case. Optionally, the processor 1310 may include one or more processing cores. Preferably, an application processor and a modem processor may be integrated into the processor 1310. The application processor mainly processes an operating system, a user interface, an application program, and the like, and the modem processor mainly processes wireless communication. It may be understood that alternatively, the modem processor may not be integrated into the processor 1310.

It should be noted that the first Hall effect sensor and the second Hall effect sensor are not units mandatory for the protective case. For the third setting manner for a Hall effect sensor and a magnet, the protective case may not include the second Hall effect sensor 1340. Based on a setting manner for a Hall effect sensor and a magnet, the protective case may further include a magnet. Optionally, the magnet may include a plurality of strip magnets such as a first magnet and a second magnet.

It should be further noted that for implementation of each instruction in this embodiment of the present invention, refer to the related descriptions in the method embodiment, and details are not described again in the present invention.

The following describes another terminal provided in an embodiment of the present invention.

Figure 14:
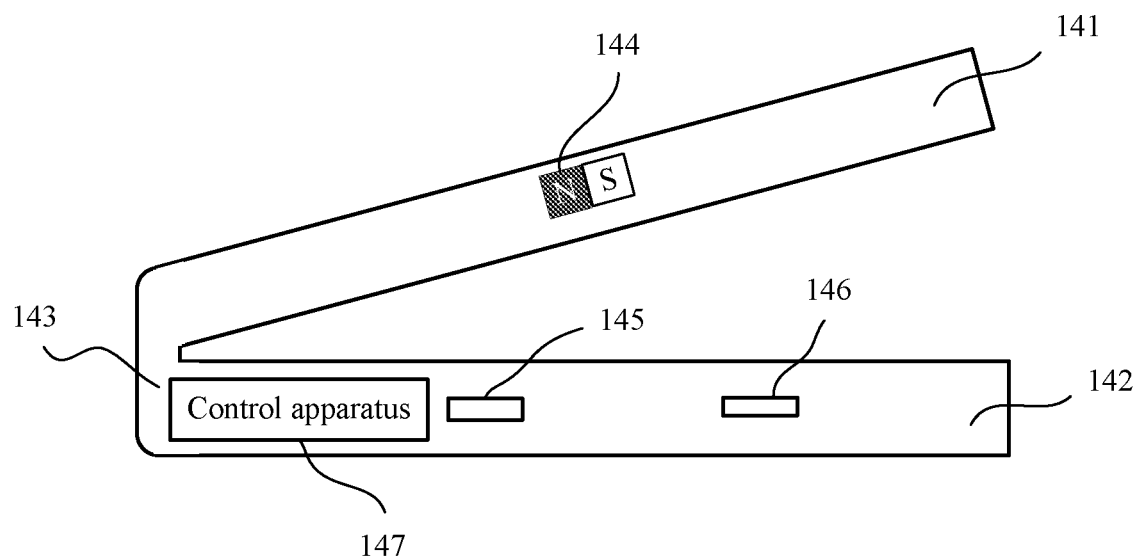
FIG. 14 is a schematic structural diagram of a flippable terminal according to an embodiment of the present invention.
Figure 15:
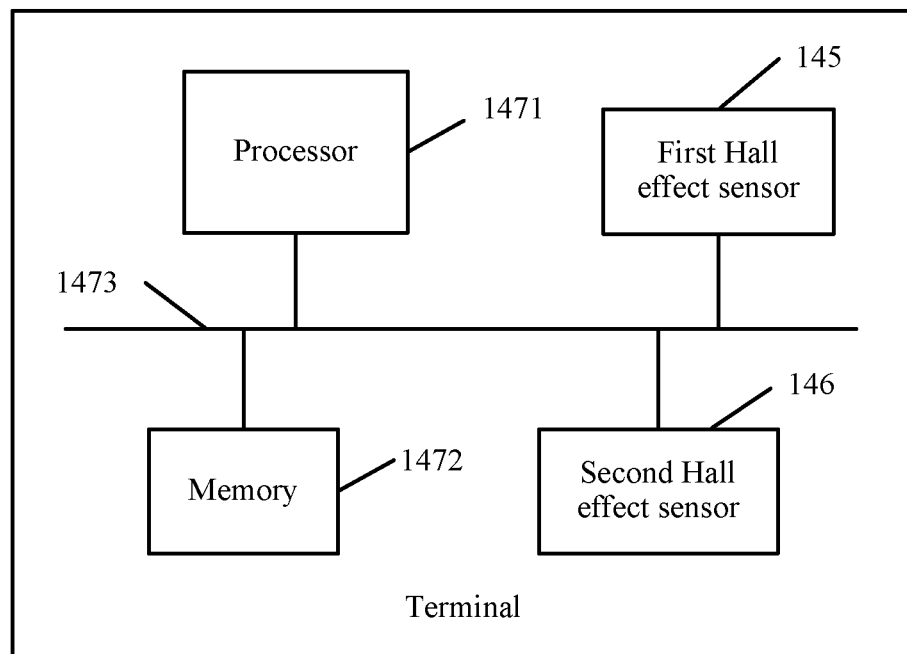
FIG. 15 is a structural framework diagram of a flippable terminal according to an embodiment of the present invention.

In this embodiment of the present invention, the terminal may be a flippable terminal. Referring to FIG. 14 and FIG. 15, FIG. 14 is a schematic structural diagram of a flippable terminal according to an embodiment of the present invention, and FIG. 15 is a structural framework diagram of a flippable terminal according to an embodiment of the present invention. A terminal control method provided in the embodiments of the present invention may also be implemented based on the flippable terminal.

The flippable terminal includes a first body 141, a second body 142, and a flip shaft 143 that connects the first body 141 and the second body 142. A magnet 144 is disposed in the first body 141, and a first Hall effect sensor 145 and a second Hall effect sensor 146 are disposed in the second body 142. A control apparatus 147 is disposed in the first body 141 or the second body 142, and the control apparatus 147 includes a processor 1471 and a memory 1472. The processor 1471 is connected to the first Hall effect sensor 145 and the second Hall effect sensor 146 by using a bus 1473.

It may be understood that, similar to a flip-up state of a protective case, a flip-up state of the flippable terminal includes a closed state of the flippable terminal and a half-closed state of the flippable terminal. It may be assumed that, when the flippable terminal is in the closed state, a first surface of the first body 141 laminates the second body.

Figure 16A:
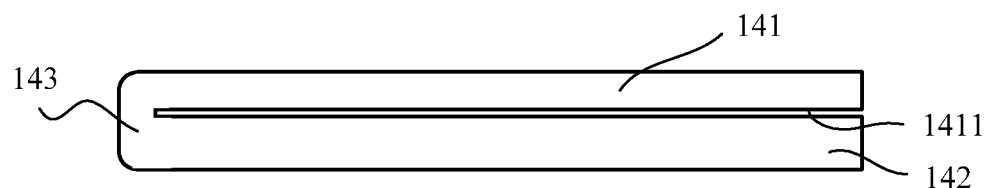
FIG. 16A is a cross-sectional schematic diagram of a flippable terminal in a closed state according to an embodiment of the present invention.

Referring to FIG. 16A, FIG. 16A is a cross-sectional schematic diagram of a flippable terminal in a closed state according to an embodiment of the present invention. The closed state of the flippable terminal is a state in which a first surface 1411 of the first body 141 of the flippable terminal laminates the second body 142.

Figure 16B:
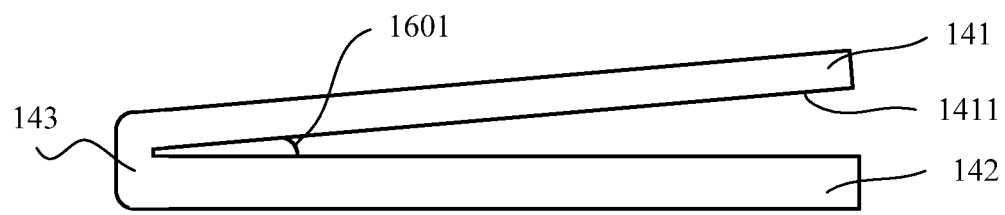
FIG. 16B is a cross-sectional schematic diagram of a flippable terminal in a half-closed state according to an embodiment of the present invention.

Referring to FIG. 16B, FIG. 16B is a cross-sectional schematic diagram of a flippable terminal in a half-closed state according to an embodiment of the present invention. The half-closed state of the flippable terminal is a state in which a fourth included angle 1601 is formed between the first surface 1411 of the first body 141 of the flippable terminal and a plane on which the second body 142 is located, and the fourth included angle is less than a fourth angle threshold. The fourth angle threshold is a maximum included angle when the first Hall effect sensor can be triggered to output a first signal and the second Hall effect sensor 146 can be triggered to output a second signal.

It may be understood that a flip-back state of the flippable terminal includes a flipped state of the flippable terminal and a half-flipped state of the flippable terminal. The first surface 1411 of the first body 141 and a second surface 1412 of the first body 141 are two surfaces disposed opposite to each other.

Figure 16C:
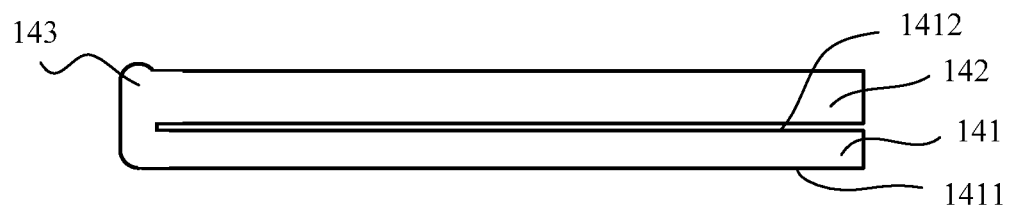
FIG. 16C is a cross-sectional schematic diagram of a flippable terminal in a flipped state according to an embodiment of the present invention.

Referring to FIG. 16C, FIG. 16C is a cross-sectional schematic diagram of a flippable terminal in a flipped state according to an embodiment of the present invention. The flipped state of the flippable terminal is a state in which the second surface 1412 of the first body 141 of the flippable terminal laminates the second body 142.

Figure 16D:
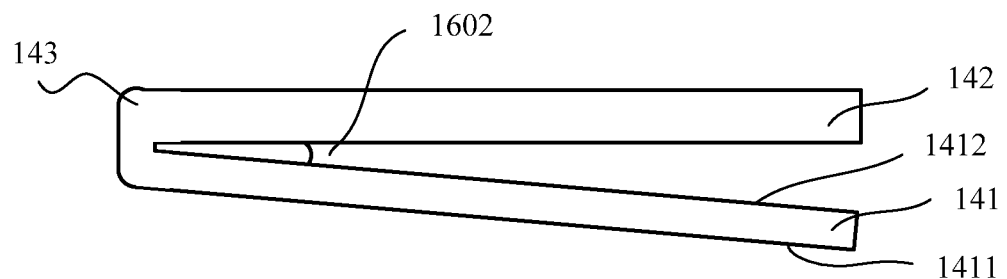
FIG. 16D is a cross-sectional schematic diagram of a flippable terminal in a half-flipped state according to an embodiment of the present invention.

Referring to FIG. 16D, FIG. 16D is a cross-sectional schematic diagram of a flippable terminal in a half-flipped state according to an embodiment of the present invention. The half-flipped state of the flippable terminal is a state in which a fifth included angle 1602 is formed between the second surface 1412 of the first body 141 of the flippable terminal and the plane on which the second body 142 is located, and the fifth included angle is less than a fifth angle threshold. Optionally, the fifth angle threshold is a maximum included angle when the first Hall effect sensor 145 can be triggered to output a third signal and the second Hall effect sensor 146 can be triggered to output a fourth signal.

Figure 16E:
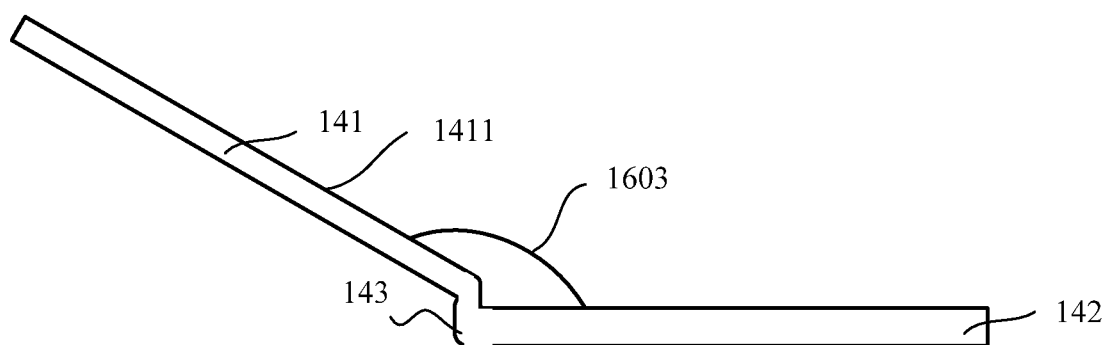
FIG. 16E is a cross-sectional schematic diagram of a flippable terminal in an expanded state according to an embodiment of the present invention.

It may be understood that the flippable terminal further includes an expanded state. Referring to FIG. 16E, FIG. 16E is a cross-sectional schematic diagram of a flippable terminal in an expanded state according to an embodiment of the present invention. In this case, a sixth included angle 1603 is formed between the first surface 1411 of the first body 141 of the flippable terminal and the plane on which the second body 142 is located, and the sixth included angle 1603 is greater than the fourth angle threshold. In an embodiment of the present invention, the sixth included angle 1603 is greater than a fourth angle threshold and less than a difference between 3600 and the fifth included angle.

When the flippable terminal is in the flip-up state, a magnetic field whose strength is not less than a first magnetic field strength and that is generated by the magnet 144 passes through a working plane of the first Hall effect sensor from a first surface of the first Hall effect sensor, and the first Hall effect sensor outputs the first signal; and a magnetic field whose strength is not less than a second magnetic field strength and that is generated by the magnet 144 passes through a working plane of the second Hall effect sensor 146 from a first surface of the second Hall effect sensor 146, and the second Hall effect sensor 146 outputs the second signal.

When the flippable terminal is in the flip-back state, the magnetic field whose strength is not less than the first magnetic field strength and that is generated by the magnet 144 passes through the working plane of the first Hall effect sensor from a second surface of the first Hall effect sensor, and the first Hall effect sensor 145 outputs the third signal; and the magnetic field whose strength is not less than the second magnetic field strength and that is generated by the magnet 144 passes through the working plane of the second Hall effect sensor 146 from a second surface of the second Hall effect sensor 146, and the second Hall effect sensor 146 outputs the fourth signal.

When a protective case is in the expanded state, a magnetic field whose strength is less than the first magnetic field strength and that is generated by the magnet 144 passes through the working plane of the first Hall effect sensor 145 from the first surface or the second surface of the first Hall effect sensor 145, and the first Hall effect sensor 145 outputs a fifth signal; and a magnetic field whose strength is less than the second magnetic field strength and that is generated by the magnet 144 passes through the working plane of the second Hall effect sensor 146 from the first surface or the second surface of the second Hall effect sensor 146, and the second Hall effect sensor 146 outputs a sixth signal. It may be understood that when the protective case is in the expanded state, a strength of a magnetic field that acts on the first Hall effect sensor 145 is less than the first magnetic field strength, and may also be 0; and a strength of a magnetic field that acts on the second Hall effect sensor 146 is less than the second magnetic field strength, and may also be 0.

In an embodiment of the present invention, the first surface of the first Hall effect sensor and the second surface of the first Hall effect sensor may be a same surface of the first Hall effect sensor, and the surface is parallel to the working plane of the first Hall effect sensor. The first surface of the second Hall effect sensor and the second surface of the second Hall effect sensor may be a same surface of the second Hall effect sensor, and the surface is parallel to the working plane of the second Hall effect sensor. In this case, the first signal is the same as the third signal, the first signal is different from the fifth signal, the second signal is the same as the fourth signal, and the second signal is different from the sixth signal.

In this case, a relative position relationship between the magnet and the Hall effect sensors may be: When the protective case is in a closed state, a connection line between a north pole and a south pole of the magnet is vertical to both the working plane of the first Hall effect sensor and the working plane of the second Hall effect sensor.

In an embodiment of the present invention, the first surface of the first Hall effect sensor 145 and the second surface of the first Hall effect sensor 145 are two opposite surfaces of the first Hall effect sensor 145, and both the first surface of the first Hall effect sensor 145 and the second surface of the first Hall effect sensor 145 are parallel to the working plane of the first Hall effect sensor 145; and the first surface of the second Hall effect sensor 146 and the second surface of the second Hall effect sensor 146 are two opposite surfaces of the second Hall effect sensor 146, and both the first surface of the second Hall effect sensor 146 and the second surface of the second Hall effect sensor 146 are parallel to the working plane of the Hall effect sensor.

In this case, a relative position relationship between the magnet and the Hall effect sensors may be: When the protective case is in a closed state, a connection line between a north pole and a south pole of the magnet is parallel to both the working plane of the first Hall effect sensor and the working plane of the second Hall effect sensor.

It may be understood that in the foregoing embodiment, a status of the terminal may be identified by using an output signal of the first Hall effect sensor and an output signal of the second Hall effect sensor. The terminal may perform different operations based on an identified status change of the terminal.

In this embodiment of the present invention, the processor 1471 is connected to the memory 1472, the first Hall effect sensor 145, and the second Hall effect sensor 146 by using the bus 1473. The processor 1471 is configured to invoke data and program code stored in the memory 1472 to perform the following step: performing a target operation in response to an operation of detecting that the output signal of the first Hall effect sensor changes and the output signal of the second Hall effect sensor changes.

Optionally, that the processor performs a target operation in response to an operation of detecting that the output signal of the first Hall effect sensor changes and the output signal of the second Hall effect sensor changes specifically includes at least one of the following steps:

performing a first operation in response to an operation of detecting that the output signal of the first Hall effect sensor changes into the first signal and the output signal of the second Hall effect sensor changes into the second signal;

performing a second operation in response to an operation of detecting that the output signal of the first Hall effect sensor changes into the third signal and the output signal of the second Hall effect sensor changes into the fourth signal; and performing a third operation in response to an operation of detecting that the output signal of the first Hall effect sensor changes into the fifth signal and the output signal of the second Hall effect sensor changes into the sixth signal.

Optionally, when it is detected that the output signal of the first Hall effect sensor 145 changes from the first signal to the fifth signal and the output signal of the second Hall effect sensor 146 changes from the second signal to the sixth signal, it indicates that the flippable terminal changes from the flip-up state to the expanded state. In this case, the processor 1471 may further perform the third operation.

Optionally, when it is detected that the output signal of the first Hall effect sensor 145 changes from the third signal to the fifth signal and the output signal of the second Hall effect sensor 146 changes from the fourth signal to the sixth signal, it indicates that the flippable terminal changes from the flip-back state to the expanded state. In this case, the processor 1471 may further perform a fourth operation.

In an embodiment of the present invention, the magnet 144 may be a strip magnet. When the flippable terminal is in the closed state, the connection line between the north pole and the south pole of the magnet 144 may be parallel to both the working plane of the first Hall effect sensor 145 and the working plane of the second Hall effect sensor 146, so that directions of a magnetic field that passes through a Hall effect sensor are different when the flippable terminal is in the closed state and the flipped state, thereby avoiding a misoperation of the flippable terminal.

It should be noted that the flippable terminal may include but is not limited to a flippable mobile computer, a flippable tablet computer, a flippable mobile phone, a flippable personal digital assistant (Personal Digital Assistant, PDA), a flippable media player, and the like.

It should be further noted that the flippable terminal may further include a communications module, an input apparatus, an output apparatus, and the like. The communications module is configured to establish a communication connection to a communication peer end for the flippable terminal, and the input apparatus is configured to implement information input. The input apparatus may be configured to receive entered digital or character information, and generate signal input that is of a keyboard, a mouse, a joystick, optics, or a trackball and that is related to a user setting and function control. The output apparatus may be configured to display information entered by a user or information provided for the user, and various graphical user interfaces (for example, a moving track display interface described in the embodiments of the present invention) of the flippable terminal. These graphical user interfaces may include a graphic, a text, an icon, a video, and any combination thereof.

For example, the flippable terminal may include a notebook computer, the first body 141 may include a screen, and the second body 142 may include a host of the notebook computer.

For example, the flippable terminal may include a collapsible screen. The collapsible screen includes a first screen and a second screen that are connected, the first screen may be located in the first body 141 of the flippable terminal, and the second screen may be located in the second body 142 of the flippable terminal.

The following describes a relative position relationship between the magnet, the first Hall effect sensor, and the second Hall effect sensor in the flippable terminal and a principle of a terminal control method.

In an embodiment of the present invention, when the flippable terminal is in the closed state, the connection line between the north pole of the magnet and the south pole of the magnet may be vertical to the working plane of the first Hall effect sensor and/or the working plane of the second Hall effect sensor. A terminal control principle of the flippable terminal is similar to that of the terminal control system shown in FIG. 4A or FIG. 4B, and details are not described again in the present invention.

In an embodiment of the present invention, the connection line between the north pole of the magnet and the south pole of the magnet may be parallel to a plane on which the first body is located. The working plane of the first Hall effect sensor and the working plane of the second Hall effect sensor may be parallel to a plane on which the second body is located. When the flippable terminal is in the closed state, the plane on which the first body 141 is located is parallel to the plane on which the second body is located, a distance between the first Hall effect sensor and a projection of the magnet onto the plane on which the second body is located is greater than a fifth distance threshold, and a distance between the second Hall effect sensor and a projection of the magnet onto the plane on which the second body is located is greater than a sixth distance threshold. The fifth distance threshold is a minimum distance between the projection of the magnet onto the plane on which the second body is located and the first Hall effect sensor when the Hall effect sensor can output the first signal and the third signal. The sixth distance threshold is a minimum distance between the projection of the magnet onto the plane on which the second body is located and the second Hall effect sensor when the Hall effect sensor can output the second signal and the fourth signal. The fifth distance threshold or the sixth distance threshold is usually greater than 0. The fifth distance threshold or the sixth distance threshold is related to distribution of magnetic field strengths of the magnet and a parameter of the Hall effect sensor, for example, a Hall coefficient of a material, a thickness of the material, and intensity of a current. Optionally, due to a fifth distance threshold or a sixth distance threshold, a value of a strength of a magnetic field that passes through a working plane of a Hall effect sensor can be not less than 0.8 mT to 3.4 mT when the flippable terminal is in the closed state or the flipped state.

Figure 17A:
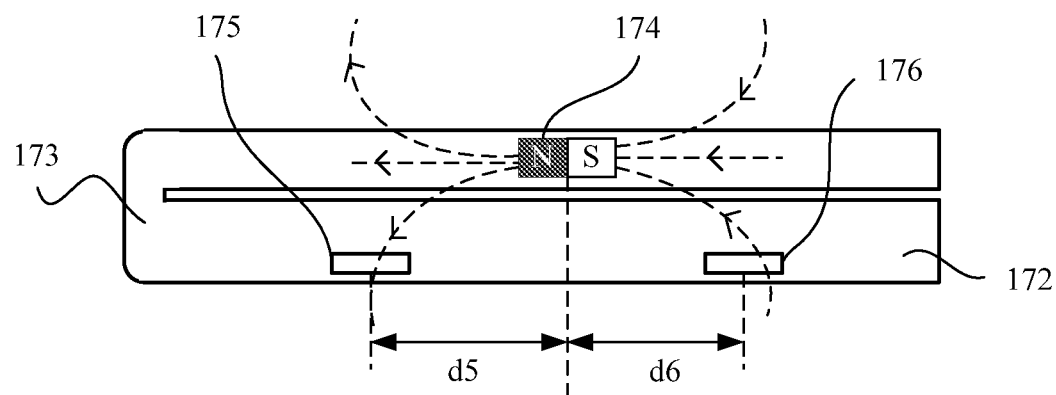
FIG. 17A is a cross-sectional schematic diagram of a first structure of a flippable terminal in a closed state according to an embodiment of the present invention.
Figure 17B:
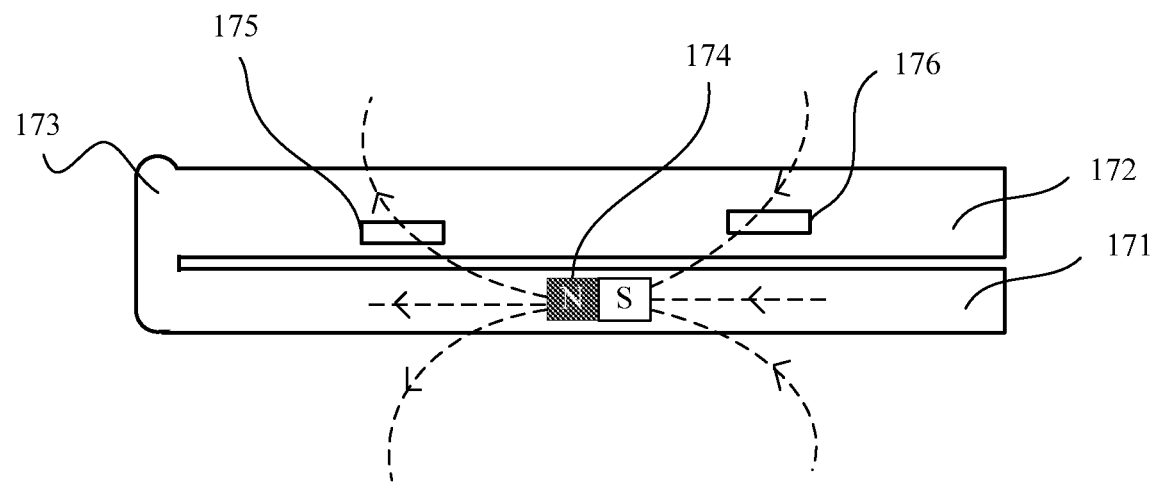
FIG. 17B is a cross-sectional schematic diagram of a first structure of a flippable terminal in a flipped state according to an embodiment of the present invention.

Referring to FIG. 17A and FIG. 17B, FIG. 17A is a cross-sectional schematic diagram of a first structure of a flippable terminal in a closed state according to an embodiment of the present invention, and FIG. 17B is a cross-sectional schematic diagram of a first structure of a flippable terminal in a flipped state according to an embodiment of the present invention. The flippable terminal includes a first body 171, a second body 172, and a flip shaft 173 that connects the first body 171 and the second body 172. A magnet 174 is disposed in the first body 171, and a connection line between a north pole of the magnet 174 and a south pole of the magnet 174 may be parallel to a plane on which the first body 171 is located. A first Hall effect sensor 175 and a second Hall effect sensor 176 are disposed in the flippable terminal, and both a working plane of the first Hall effect sensor 175 and a working plane of the second Hall effect sensor 176 are parallel to a plane on which a base plate 221 is located. A distance d5 between the first Hall effect sensor 175 and a projection of the magnet onto a plane on which the second body 172 is located is greater than a fifth distance threshold, and a distance d6 between the second Hall effect sensor 176 and a projection of the magnet onto the plane on which the second body 172 is located is greater than a sixth distance threshold.

In an embodiment of the present invention, the connection line between the north pole of the magnet and the south pole of the magnet may be vertical to the plane on which the first body is located. The working plane of the first Hall effect sensor and the working plane of the second Hall effect sensor may be vertical to the plane on which the first body is located. When the flippable terminal is in the closed state, the plane on which the first body is located is parallel to the plane on which the second body is located. A distance between the first Hall effect sensor and a projection of the magnet onto the plane on which the second body is located is greater than a seventh distance threshold, and a distance between the second Hall effect sensor and a projection of the magnet onto the plane on which the second body is located is greater than an eighth distance threshold. The seventh distance threshold is a minimum distance between a projection of the magnet onto a plane on which the flippable terminal is located and the first Hall effect sensor when the Hall effect sensor can output a first signal and a third signal. The eighth distance threshold is a minimum distance between the projection of the magnet onto the plane on which the second body is located and the second Hall effect sensor when the Hall effect sensor can output a second signal and a fourth signal. The seventh distance threshold or the eighth distance threshold is usually greater than 0. The seventh distance threshold or the eighth distance threshold is related to distribution of magnetic field strengths of the magnet and a parameter of the Hall effect sensor, for example, a Hall coefficient of a material, a thickness of the material, and intensity of a current. Optionally, due to the seventh distance threshold or the eighth distance threshold, a value of a strength of a magnetic field that passes through a working plane of a Hall effect sensor can be not less than 0.8 mT to 3.4 mT when the flippable terminal is in the closed state or the flipped state.

Figure 18A:
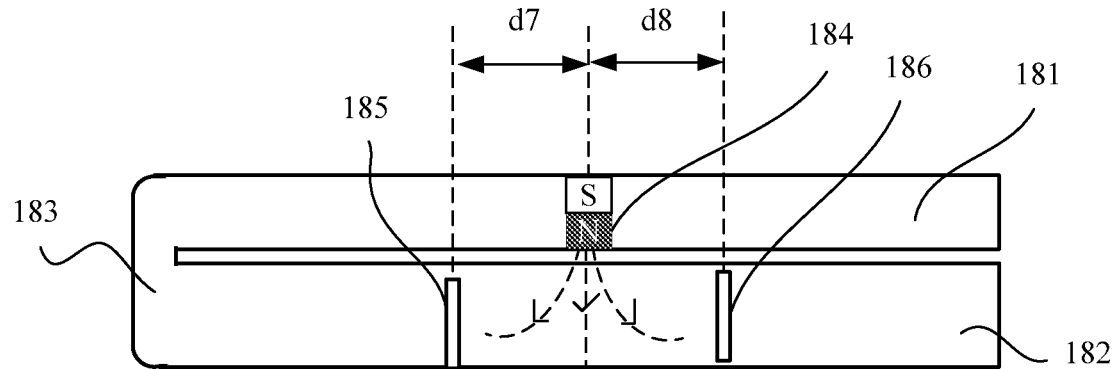
FIG. 18A is a cross-sectional schematic diagram of a second structure of a flippable terminal when the flippable terminal is in a closed state according to an embodiment of the present invention.
Figure 18B:
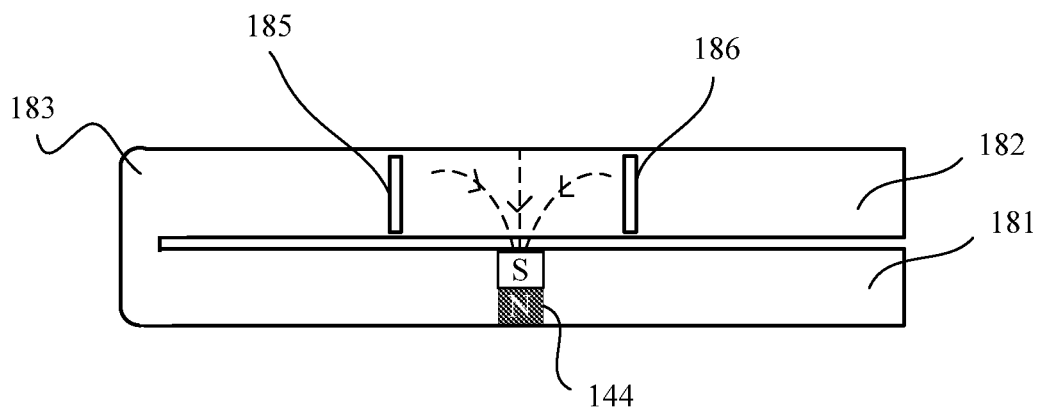
FIG. 18B is a cross-sectional schematic diagram of a second structure of a flippable terminal when the flippable terminal is in a flipped state according to an embodiment of the present invention.

Referring to FIG. 18A and FIG. 18B, FIG. 18A is a cross-sectional schematic diagram of a second structure of a flippable terminal when the flippable terminal is in a closed state according to an embodiment of the present invention, and FIG. 18B is a cross-sectional schematic diagram of a second structure of a flippable terminal when the flippable terminal is in a flipped state according to an embodiment of the present invention. The flippable terminal includes a first body 181, a second body 182, and a flip shaft 183 that connects the first body 181 and the second body 182. A magnet 184 is disposed in the first body 181, and a connection line between a north pole of the magnet 184 and a south pole of the magnet 184 may be vertical to a plane on which the first body 181 is located. A first Hall effect sensor 185 and a second Hall effect sensor 186 are disposed in the second body 182, and both a working plane of the first Hall effect sensor 185 and a working plane of the second Hall effect sensor 186 are vertical to a plane on which the second body 182 is located. A distance d7 between the first Hall effect sensor 185 and a projection of the magnet onto the plane on which the second body 182 is located is greater than a seventh distance threshold, and a distance d8 between the second Hall effect sensor 186 and a projection of the magnet onto the plane on which the second body 182 is located is greater than an eighth distance threshold.

When the flippable terminal is in a flip-up state, as shown in FIG. 17A or FIG. 18A, a magnetic field whose strength is not less than a first magnetic field strength and that is generated by the magnet passes through the working plane of the first Hall effect sensor from a first surface of the first Hall effect sensor (an upper surface of the first Hall effect sensor 175 in FIG. 17A and a right surface of the first Hall effect sensor 185 in FIG. 18A), a north-pole interrupt occurs in the first Hall effect sensor, and the first Hall effect sensor outputs the first signal such as a high-level signal; and a magnetic field whose strength is not less than a second magnetic field strength and that is generated by the magnet passes through the working plane of the second Hall effect sensor from a first surface of the second Hall effect sensor (a lower surface of the second Hall effect sensor 176 in FIG. 17A and a left surface of the second Hall effect sensor 186 in FIG. 18A), a south-pole interrupt occurs in the second Hall effect sensor, and the second Hall effect sensor outputs the second signal such as a low-level signal.

When the flippable terminal is in a flip-back state, as shown in FIG. 17B or FIG. 18B, the magnetic field whose strength is not less than the first magnetic field strength and that is generated by the magnet passes through the working plane of the first Hall effect sensor from a second surface of the first Hall effect sensor (a lower surface of the first Hall effect sensor 175 in FIG. 17A and a left surface of the first Hall effect sensor 185 in FIG. 18A), a south-pole interrupt occurs in the first Hall effect sensor, and the first Hall effect sensor outputs the third signal such as a low-level signal; and the magnetic field whose strength is not less than the second magnetic field strength and that is generated by the magnet passes through the working plane of the second Hall effect sensor from a second surface of the second Hall effect sensor 146 (an upper surface of the second Hall effect sensor 176 in FIG. 17A and a right surface of the second Hall effect sensor 186 in FIG. 18A), a north-pole interrupt occurs in the second Hall effect sensor, and the second Hall effect sensor outputs the fourth signal such as a high-level signal.

It should be noted that, when the first Hall effect sensor can output the first signal and the third signal and the second Hall effect sensor can output the second signal and the fourth signal, an angle may be formed between the working plane of the first Hall effect sensor and/or the working plane of the second Hall effect sensor and the plane on which the second body is located, and/or an angle is formed between the connection line between the north pole of the magnet and the south pole of the magnet and the plane on which the first body is located, so that when the flippable terminal is in the closed state, an angle is formed between the working plane of the first Hall effect sensor and/or the working plane of the second Hall effect sensor and the connection line between the north pole of the magnet and the south pole of the magnet.

Figure 19A:
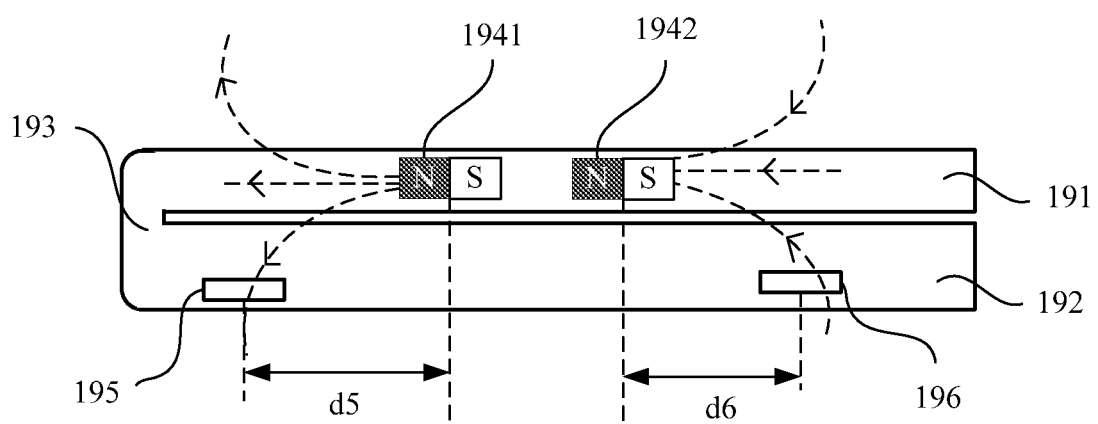
FIG. 19A is a cross-sectional schematic diagram of a third structure of a flippable terminal when the flippable terminal is in a closed state according to an embodiment of the present invention.
Figure 19B:
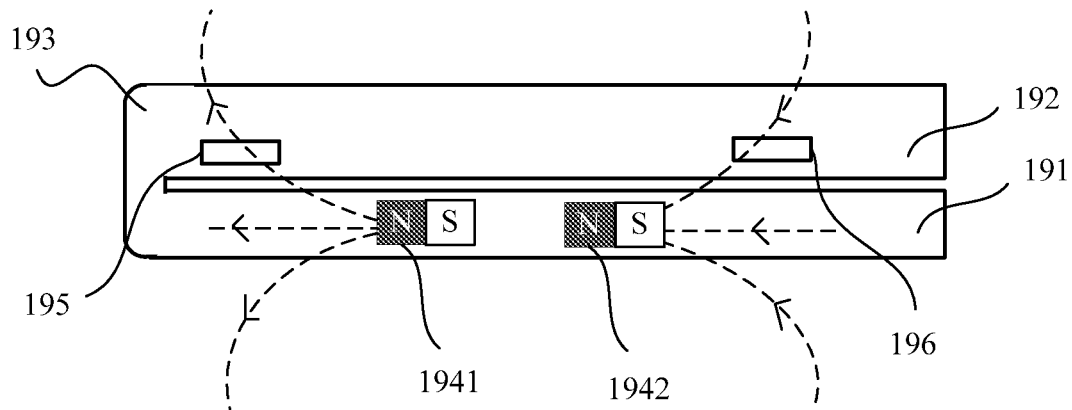
FIG. 19B is a cross-sectional schematic diagram of a third structure of a flippable terminal when the flippable terminal is in a flipped state according to an embodiment of the present invention.

In an embodiment of the present invention, the flippable terminal may include a plurality of magnets such as a first magnet and a second magnet. The first magnet mainly acts on the first Hall effect sensor, and the second magnet mainly acts on the second Hall effect sensor. Referring to FIG. 19A and FIG. 19B, FIG. 19A is a cross-sectional schematic diagram of a third structure of a flippable terminal when the flippable terminal is in a closed state according to an embodiment of the present invention, and FIG. 19B is a cross-sectional schematic diagram of a third structure of a flippable terminal when the flippable terminal is in a flipped state according to an embodiment of the present invention. The flippable terminal includes a first body 191, a second body 192, and a flip shaft 193 that connects the first body 191 and the second body 192. A first magnet 1941 and a second magnet 1942 are disposed in the first body 191, and both a connection line between a north pole of the first magnet 1941 and a south pole of the first magnet 1941 and a connection line between a north pole of the second magnet 1942 and a south pole of the second magnet 1942 may be parallel to a plane on which the second body 192 is located. A first Hall effect sensor 195 and a second Hall effect sensor 196 are disposed in the second body 192, and both a working plane of the first Hall effect sensor 195 and a working plane of the second Hall effect sensor 196 are parallel to the plane on which the second body 192 is located. A distance d5 between the first Hall effect sensor 195 and a projection of the first magnet 1941 onto the plane on which the second body 192 is located is greater than a fifth distance threshold, and a distance d6 between the second Hall effect sensor 196 and a projection of the second magnet 1942 onto the plane on which the second body 192 is located is greater than a sixth distance threshold. For descriptions of the fifth distance threshold or the sixth distance threshold, refer to the related descriptions in the foregoing embodiment. Details are not described again in the present invention.

When the flippable terminal is in a flip-up state, a magnetic field whose strength is not less than a first magnetic field strength and that is generated by the first magnet 1941 passes through the working plane of the first Hall effect sensor 195 from a first surface (an upper surface) of the first Hall effect sensor 195, a north-pole interrupt occurs in the first Hall effect sensor 195, and the first Hall effect sensor 195 outputs a first signal such as a high-level signal; and a magnetic field whose strength is not less than a second magnetic field strength and that is generated by the second magnet 1942 passes through the working plane of the second Hall effect sensor 196 from a first surface (a lower surface) of the second Hall effect sensor 196, a south-pole interrupt occurs in the first Hall effect sensor 195, and the second Hall effect sensor 196 outputs a second signal such as a low-level signal.

When the flippable terminal is in a flip-back state, the magnetic field whose strength is not less than the first magnetic field strength and that is generated by the first magnet passes through the working plane of the first Hall effect sensor 195 from a second surface (a lower surface) of the first Hall effect sensor 195, a south-pole interrupt occurs in the first Hall effect sensor 195, and the first Hall effect sensor 195 outputs a third signal such as a low-level signal; and the magnetic field whose strength is not less than the second magnetic field strength and that is generated by the second magnet passes through the working plane of the second Hall effect sensor 196 from a second surface (an upper surface) of the second Hall effect sensor 196, a north-pole interrupt occurs in the second Hall effect sensor 196, and the second Hall effect sensor 196 outputs a fourth signal such as a high-level signal.

It should be noted that both the connection line between the north pole of the first magnet and the south pole of the first magnet and the connection line between the north pole of the second magnet and the south pole of the second magnet may be vertical to a plane on which the first body is located, and both the working plane of the first Hall effect sensor and the working plane of the second Hall effect sensor are vertical to the plane on which the second body is located.

It should be further noted that, when the first Hall effect sensor can output the first signal and the third signal and the second Hall effect sensor can output the second signal and the fourth signal, an angle may be formed between the working plane of the first Hall effect sensor and/or the working plane of the second Hall effect sensor and the plane on which the second body is located, and/or an angle is formed between the connection line between the north pole of the first magnet and the south pole of the first magnet and/or the connection line between the north pole of the first magnet and the south pole of the first magnet and the plane on which the first body is located, so that when the flippable terminal is in the closed state, an angle is formed between the working plane of the first Hall effect sensor and the connection line between the north pole of the first magnet and the south pole of the first magnet, and/or an angle is formed between the working plane of the second Hall effect sensor and the connection line between the north pole of the second magnet and the south pole of the second magnet.

Figure 20:
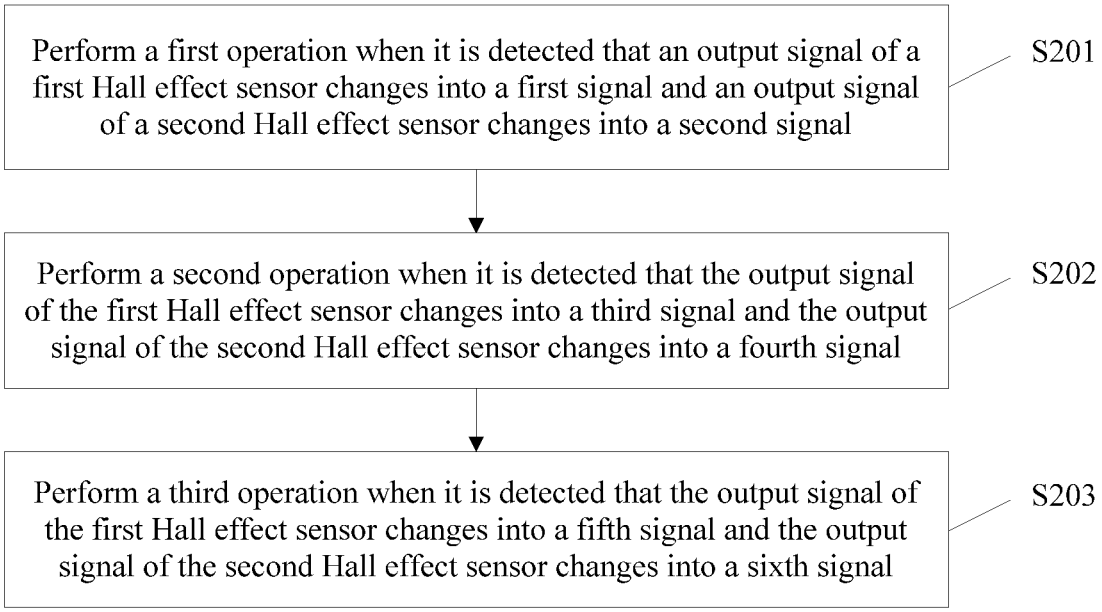
FIG. 20 is a schematic flowchart of a terminal control method according to an embodiment of the present invention.

Referring to FIG. 20, FIG. 20 is a schematic flowchart of a terminal control method according to an embodiment of the present invention. The terminal control method may be implemented based on the terminal control system shown in FIG. 1, or may be implemented based on only the flippable terminal shown in FIG. 14. The terminal control method may include: performing, by a terminal, a target operation in response to an operation of detecting that an output signal of a first Hall effect sensor changes and an output signal of a second Hall effect sensor changes.

A magnetic field is a magnetic field generated by a magnet built in the terminal, or a magnetic field generated by a magnet built in a protective case of the terminal.

The terminal may be a terminal in a terminal control system, or may be a flippable terminal.

Specifically, an implementation of the performing a target operation in response to an operation of detecting that an output signal of a first Hall effect sensor changes and an output signal of a second Hall effect sensor changes includes at least one of the following steps:

Step S201: Perform a first operation in response to an operation of detecting that an output signal of a first Hall effect sensor changes into a first signal and an output signal of a second Hall effect sensor changes into a second signal.

Step S202: Perform a second operation in response to an operation of detecting that the output signal of the first Hall effect sensor changes into a third signal and the output signal of the second Hall effect sensor changes into a fourth signal.

Step S203: Perform a third operation in response to an operation of detecting that the output signal of the first Hall effect sensor changes into the fifth signal and the output signal of the second Hall effect sensor changes into the sixth signal.

It should be noted that for descriptions of the first signal, the second signal, the third signal, the fourth signal, the fifth signal, the sixth signal, relative positions of the magnet, the first Hall effect sensor, the second Hall effect sensor, and the like, refer to the related descriptions in the foregoing embodiment. Details are not described again in the present invention.

In an embodiment of the present invention, when the protective case or the flippable terminal is in a closed state, a connection line between a north pole and a south pole of the magnet is vertical to both a working plane of the first Hall effect sensor and a working plane of the second Hall effect sensor. In this case, the terminal cannot identify a flip-up state or a flip-back state of the protective case, and the flippable terminal cannot identify a flip-up state or a flip-back state of the flippable terminal.

In this case, when it is detected that the output signal of the first Hall effect sensor changes into the first signal and the output signal of the second Hall effect sensor changes into the second signal, it indicates that the protective case 22 changes from an expanded state to the flip-up state. In this case, the terminal 21 may perform the first operation such as a screen off operation.

When it is detected that the output signal of the first Hall effect sensor changes into the fifth signal and the output signal of the second Hall effect sensor changes into the sixth signal, it indicates that the protective case 22 changes into the expanded state. In this case, the terminal 21 may perform the second operation such as a screen wakeup operation.

In an embodiment of the present invention, when the protective case or the flippable terminal is in a closed state, a connection line between a north pole and a south pole of the magnet is parallel to both a working plane of the first Hall effect sensor and a working plane of the second Hall effect sensor. The first signal and third signal have opposite polarities, both the first signal and the third signal are different from the fifth signal, the second signal and the fourth signal have opposite polarities, and both the second signal and the fourth signal are different from the sixth signal.

In this case, when it is detected that the output signal of the first Hall effect sensor changes into the first signal and the output signal of the second Hall effect sensor changes into the second signal, it indicates that a status of the protective case or the flippable terminal changes into the flip-up state. In this case, the terminal or the flippable terminal may perform the first operation. When it is detected that the output signal of the first Hall effect sensor changes into the third signal and the output signal of the second Hall effect sensor changes into the fourth signal, it indicates that a status of the protective case or the flippable terminal changes into the flip-back state. In this case, the terminal or the flippable terminal may perform the second operation.

The terminal can identify the flip-up state or the flip-back state of the protective case, or the flippable terminal can identify the flip-up state or the flip-back state of the flippable terminal.

Optionally, an implementation of step S203 may include: performing the third operation in response to an operation of detecting that the output signal of the first Hall effect sensor changes from the first signal to the fifth signal and the output signal of the second Hall effect sensor changes from the second signal to the sixth signal.

Optionally, an implementation of step S203 may further include: when it is detected that the output signal of the first Hall effect sensor changes from the third signal to the fifth signal and the output signal of the second Hall effect sensor changes from the fourth signal to the sixth signal, it indicates that the protective case or the flippable terminal changes from the flip-back state to the expanded state. In this case, the terminal or the flippable terminal may perform a fourth operation.

It may be understood that step S201, step S202, and step S203 may be performed in any order.

For the flippable terminal, the magnet, the first Hall effect sensor, and the second Hall effect sensor are all located in the flippable terminal, the flippable terminal detects the output signal of the first Hall effect sensor and the output signal of the second Hall effect sensor, and the terminal is controlled, based on a change status of the output signal, to perform a corresponding operation.

For the terminal control system including the protective case and the terminal, a position setting manner for the magnet, the first Hall effect sensor, and the second Hall effect sensor may include any one of the first to the fifth setting manners for a Hall effect sensor and a magnet. In any other setting manner for a Hall effect sensor and a magnet, for a relative position relationship between the magnet, the first Hall effect sensor, and the second Hall effect sensor, refer to any setting manner for the relative position relationship in FIG. 4A, FIG. 4B, FIG. 4C, FIG. 4D, FIG. 5A, FIG. 5B, FIG. 6, and FIG. 7, and details are not described again in the present invention.

When the first Hall effect sensor and/or the second Hall effect sensor are or is disposed in the terminal, the terminal detects the output signal of the first Hall effect sensor and the output signal of the second Hall effect sensor, and the terminal is controlled, based on a change status of the output signal, to perform a corresponding operation.

When the first Hall effect sensor and/or the second Hall effect sensor are or is disposed in the protective case, the protective case detects the output signal of the first Hall effect sensor and the output signal of the second Hall effect sensor. The terminal needs to exchange information with the protective case, so that the terminal obtains a change status of the signals or the signal, detected by the protective case, of the first Hall effect sensor and/or the second Hall effect sensor.

Specifically, the protective case may send an operation indication instruction to the terminal. The operation indication instruction is an instruction that is generated by the protective case based on a change of the output signal of the first Hall effect sensor and a change of the output signal of the second Hall effect sensor and that is sent to the terminal, and is used to instruct the terminal to perform the target operation. The terminal receives the operation indication instruction, and performs the target operation according to the operation indication instruction.

It may be understood that the operation indication instruction may include but is not limited to a first operation indication instruction, a second operation indication instruction, a third operation indication instruction, and the like in the foregoing embodiment, and correspondingly, the target operation includes but is not limited to the first operation, the second operation, the third operation, and the like. For descriptions of each operation instruction, refer to the related descriptions in the foregoing embodiment, and details are not described again in the present invention.

Figure 21:
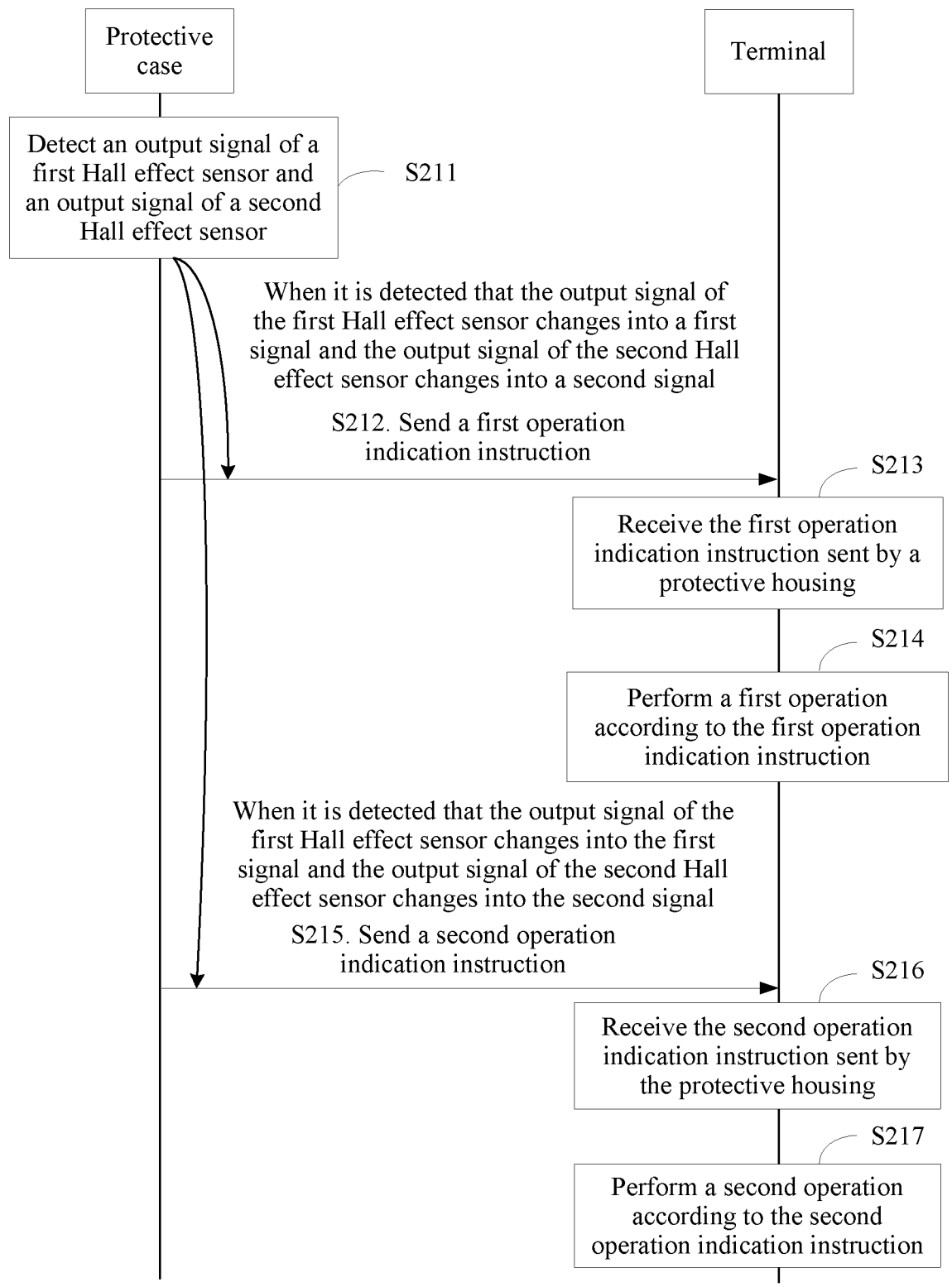
FIG. 21 is a schematic flowchart of another terminal control method according to an embodiment of the present invention.

For example, the first Hall effect sensor and the second Hall effect sensor are disposed in the protective case. Referring to FIG. 21, FIG. 21 is a schematic flowchart of another terminal control method according to an embodiment of the present invention. The terminal control method includes the following steps:

Step S211: A protective case detects an output signal of a first Hall effect sensor and an output signal of a second Hall effect sensor.

Step S212: The protective case sends a first operation indication instruction to a terminal when the protective case detects that the output signal of the first Hall effect sensor changes into a first signal and the output signal of the second Hall effect sensor changes into a second signal.

The first operation indication instruction is generated by the protective case when the protective case detects that the output signal of the first Hall effect sensor changes into the first signal and the signal of the second Hall effect sensor changes into the second signal, and is used to instruct the terminal to perform a first operation.

Step S213: The terminal receives the first operation indication instruction.

Step S214: The terminal performs a first operation according to the first operation indication instruction.

Optionally, the first operation indication instruction may also include the first signal and the second signal. The terminal may identify, based on the first signal and the second signal, that a status of the protective case changes into a flip-up state, to perform the first operation.

Step S215: The protective case sends the first operation indication instruction to the terminal when the protective case detects that the output signal of the first Hall effect sensor changes into a third signal and the output signal of the second Hall effect sensor changes into a fourth signal.

A second operation indication instruction is generated by the protective case when the protective case detects that the output signal of the first Hall effect sensor changes into the third signal and the signal of the second Hall effect sensor changes into the fourth signal, and is used to instruct the terminal to perform a second operation.

Step S216: The terminal receives the second operation indication instruction.

Step S217: The terminal performs a second operation according to the second operation indication instruction.

Optionally, the second operation indication instruction may also include the third signal and the fourth signal. The terminal may identify, based on the third signal and the fourth signal, that the status of the protective case changes into a flip-back state, to perform the second operation.

In an embodiment of the present invention, the protective case sends the detected signal of the first Hall effect sensor and the detected signal of the second Hall effect sensor to the terminal in real time, and the terminal detects a status change of the protective case based on the received output signal of the first Hall effect sensor and the received output signal of the second Hall effect sensor. When the output signal of the first Hall effect sensor changes into the first signal and the output signal of the second Hall effect sensor changes into the second signal, the terminal detects that the status of the protective case changes into the flip-up state, and performs the first operation. When the output signal of the first Hall effect sensor changes into the third signal and the output signal of the second Hall effect sensor changes into the fourth signal, the terminal detects that the status of the protective case changes into the flip-back state, and performs the second operation.

It should be noted that step S212 and step S215 may be performed in any order.

In an embodiment of the present invention, the method further includes:

sending, by the protective case, a third operation indication instruction to the terminal when the protective case detects that the output signal of the first Hall effect sensor changes into a fifth signal and the output signal of the second Hall effect sensor changes into a sixth signal;

receiving, by the terminal, the third operation indication instruction; and performing, by the terminal, a third operation according to the third operation indication instruction.

The third operation indication instruction is generated by the protective case when the protective case detects that the output signal of the first Hall effect sensor changes into the fifth signal and the signal of the second Hall effect sensor changes into the sixth signal, and is used to instruct the terminal to perform the third operation.

Optionally, the third operation indication instruction may also include the fifth signal and the sixth signal. The terminal may identify, based on the fifth signal and the sixth signal, that the status of the protective case changes into an expanded state, to perform the third operation.

In an embodiment of the present invention, the method further includes:

sending, by the protective case, a third operation indication instruction to the terminal when the protective case detects that the output signal of the first Hall effect sensor changes from the first signal to a fifth signal and the output signal of the second Hall effect sensor changes from the second signal to a sixth signal;

receiving, by the terminal, the third operation indication instruction; and performing, by the terminal, a third operation according to the third operation indication instruction.

The third operation indication instruction is generated by the protective case when the protective case detects that the output signal of the first Hall effect sensor changes from the first signal to the fifth signal and the output signal of the second Hall effect sensor changes from the second signal to the sixth signal, and is used to instruct the terminal to perform the third operation.

Optionally, the third operation indication instruction may also include the first signal, the second signal, the fifth signal, and the sixth signal. The terminal may identify, based on the first signal, the second signal, the fifth signal, and the sixth signal, that the status of the protective case changes from the flip-up state to an expanded state, to perform the third operation.

In an embodiment of the present invention, the method further includes:

sending, by the protective case, a fourth operation indication instruction to the terminal when the protective case detects that the output signal of the first Hall effect sensor changes from the third signal to a fifth signal and the output signal of the second Hall effect sensor changes from the fourth signal to a sixth signal;

receiving, by the terminal, the fourth operation indication instruction; and performing, by the terminal, a fourth operation according to the fourth operation indication instruction.

The fourth operation indication instruction is generated by the protective case when the protective case detects that the output signal of the first Hall effect sensor changes from the third signal to the fifth signal and the output signal of the second Hall effect sensor changes from the fourth signal to the sixth signal, and is used to instruct the terminal to perform the fourth operation.

Optionally, the fourth operation indication instruction may also include the third signal, the fourth signal, the fifth signal, and the sixth signal. The terminal may identify, based on the third signal, the fourth signal, the fifth signal, and the sixth signal, that the status of the protective case changes from the flip-back state to an expanded state, to perform the fourth operation.

It should be noted that for working planes of the Hall effect sensors, each signal, a first magnet field strength, a second magnet field strength, the flip-up state, the flip-back state, the expanded state, and the like, refer to the related descriptions in the foregoing embodiment. Details are not described again in the present invention.

It should be further noted that, in the method embodiments of this application, the first operation, the second operation, the third operation, and the fourth operation may be the same or different, and this is not limited in the present invention.

Optionally, the terminal may include a screen. The first operation may be a screen off operation, and the second operation may be a screen wakeup operation or no operation; or the first operation may be a screen locking operation, and the second operation may be an unlocking operation, an operation of entering an unlocking interface, no operation, or the like; or the first operation may be an operation of closing a specified application, and the second operation may be an operation of opening the specified application, for example, the first operation is an operation of exiting Facebook, and the second operation is an operation of logging in to Facebook; or the first operation may be a power-off operation, and the second operation may be a power-on operation; or when there is a coming call, the first operation may be an operation of hanging up for the current coming call, and the second operation may be an operation of answering the current coming call; or when a current display interface is a display interface of a video application, the first operation may be an operation of suspending a current displayed video, and the second operation may be an operation of playing the current displayed video. Alternatively, the first operation and the second operation may be other operations, and this is not limited in the present invention.

Optionally, a user sets a specific operation for the third operation or the fourth operation on the terminal. For example, the third operation is a screen wakeup operation, an unlocking operation, an operation of entering an unlocking interface, an operation of opening a specified application, or an operation of increasing screen brightness, and the fourth operation is a screen off operation, a screen locking operation, an operation of closing the specified operation, or an operation of reducing the screen brightness. Alternatively, the third operation or the fourth operation may be another operation, and this is not limited in the present invention.

In this embodiment of the present invention, when it is detected that the output signal of the first Hall effect sensor changes into the first signal and the output signal of the second Hall effect sensor changes into the second signal, the terminal performs the first operation; or when it is detected that the output signal of the first Hall effect sensor changes into the third signal and the output signal of the second Hall effect sensor changes into the fourth signal, the terminal performs the second operation. The terminal can be controlled only when a position of the magnet meets response requirements for the two Hall effect sensors. In this way, terminal control is more precise.

In addition, in this embodiment of the present invention, positions of the magnet, the first Hall effect sensor, and the second Hall effect sensor are set, so that the first signal and the third signal have opposite polarities, and the second signal and the fourth signal have opposite polarities, thereby avoiding a misoperation of the terminal and improving user experience.

Figure 22:
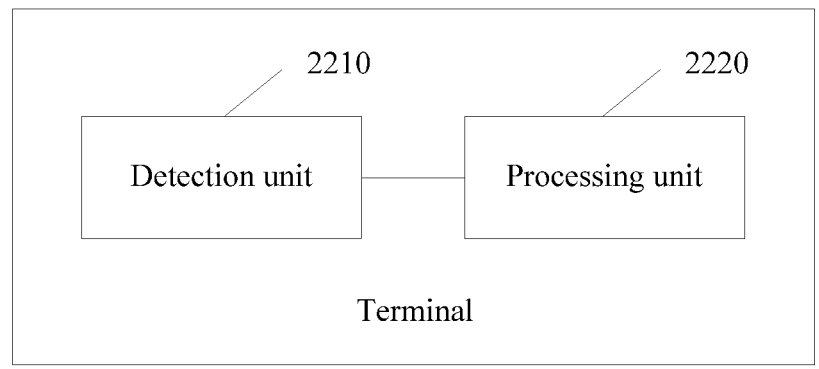
FIG. 22 is a schematic structural diagram of a fourth terminal according to an embodiment of the present invention.

Referring to FIG. 22, FIG. 22 is a schematic structural diagram of a fourth terminal according to an embodiment of the present invention. The terminal may include:

a detection unit 2210, configured to detect a change of an output signal of a first Hall effect sensor and a change of an output signal of a second Hall effect sensor; and a processing unit 2220, configured to perform a target operation in response to an operation of detecting that the output signal of the first Hall effect sensor changes and the output signal of the second Hall effect sensor changes, where the first Hall effect sensor and the first Hall effect sensor output signals by sensing a magnetic field; and the magnetic field is a magnetic field generated by a magnet built in the terminal, or a magnetic field generated by a magnet built in a protective case of the terminal.

In an embodiment of the present invention, the processing unit 2220 is specifically configured to perform at least one of the following steps:

performing a first operation in response to an operation of detecting that the output signal of the first Hall effect sensor changes into a first signal and the output signal of the second Hall effect sensor changes into a second signal;

performing a second operation in response to an operation of detecting that the output signal of the first Hall effect sensor changes into a third signal and the output signal of the second Hall effect sensor changes into a fourth signal; and performing a third operation in response to an operation of detecting that the output signal of the first Hall effect sensor changes into a fifth signal and the output signal of the second Hall effect sensor changes into a sixth signal, where the first signal is an electrical signal output by the first Hall effect sensor when a magnetic field whose strength is not less than a first magnetic field strength passes through a working plane of the first Hall effect sensor from a first surface of the first Hall effect sensor, and the second signal is an electrical signal output by the second Hall effect sensor when a magnetic field whose strength is not less than a second magnetic field strength passes through a working plane of the second Hall effect sensor from a first surface of the second Hall effect sensor;

the third signal is an electrical signal output by the first Hall effect sensor when the magnetic field whose strength is not less than the first magnetic field strength passes through the working plane of the first Hall effect sensor from a second surface of the first Hall effect sensor, and the fourth signal is an electrical signal output by the second Hall effect sensor when the magnetic field whose strength is not less than the second magnetic field strength passes through the working plane of the second Hall effect sensor from a second surface of the second Hall effect sensor; and the fifth signal is an electrical signal output by the first Hall effect sensor when a magnetic field whose strength is less than the first magnetic field strength passes through the working plane of the first Hall effect sensor, and the sixth signal is an electrical signal output by the second Hall effect sensor when a magnetic field whose strength is less than the second magnetic field strength passes through the working plane of the second Hall effect sensor.

In an embodiment of the present invention, the first surface of the first Hall effect sensor and the second surface of the first Hall effect sensor are two opposite surfaces of the first Hall effect sensor, and both the first surface of the first Hall effect sensor and the second surface of the first Hall effect sensor are parallel to the working plane of the first Hall effect sensor; and the first surface of the second Hall effect sensor and the second surface of the second Hall effect sensor are two opposite surfaces of the second Hall effect sensor, and both the first surface of the second Hall effect sensor and the second surface of the second Hall effect sensor are parallel to the working plane of the Hall effect sensor.

In an embodiment of the present invention, the first Hall effect sensor and the second Hall effect sensor are disposed in the protective case; and the terminal further includes a receiving unit, configured to receive an operation indication instruction sent by the protective case, where the operation indication instruction is an instruction that is generated by the protective case based on the change of the output signal of the first Hall effect sensor and the change of the output signal of the second Hall effect sensor and that is sent to the terminal, and is used to instruct the terminal to perform the target operation.

In an embodiment of the present invention, the magnet is a strip magnet, and the protective case includes a base plate and a flip plate that are used to fasten the terminal, and a flip shaft that connects the base plate and the flip plate; and the first Hall effect sensor and the second Hall effect sensor are disposed in the flip plate of the protective case, and the strip magnet is disposed in the terminal or the base plate of the protective case; or the strip magnet is disposed in the flip plate of the protective case, and the first Hall effect sensor and the second Hall effect sensor are disposed in the terminal or the base plate of the protective case.

In an embodiment of the present invention, the magnet is a strip magnet, and the terminal includes a first body, a second body, and a flip shaft that connects the first body and the second body; and the first Hall effect sensor and the second Hall effect sensor are disposed in the first body, and the strip magnet is disposed in the second body.

In an embodiment of the present invention, the working plane of the first Hall effect sensor is parallel to the working plane of the second Hall effect sensor; and when the terminal is in a closed state, a connection line between a north pole of the magnet and a south pole of the magnet is parallel to the working plane of the first Hall effect sensor, and a distance between the first Hall effect sensor or the second Hall effect sensor and a projection of the strip magnet onto a plane on which the working plane of the first Hall effect sensor is located is greater than a first distance threshold.

In an embodiment of the present invention, the magnet includes a first magnet and a second magnet, the first magnet generates the magnetic field whose strength is not less than the first magnetic field strength, and the second magnet generates the magnetic field whose strength is not less than the second magnetic field strength.

Figure 23:
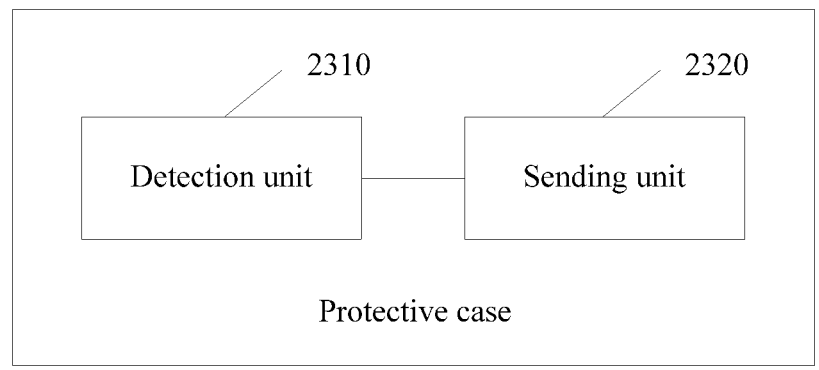
FIG. 23 is a schematic structural diagram of another protective case according to an embodiment of the present invention.

Referring to FIG. 23, FIG. 23 is a schematic structural diagram of another protective case according to an embodiment of the present invention. The protective case includes:

a detection unit 2310, configured to detect an output signal of a first Hall effect sensor and an output signal of a second Hall effect sensor; and a sending unit 2320, configured to send an operation indication instruction to a terminal in response to an operation of detecting that the output signal of the first Hall effect sensor changes and the output signal of the second Hall effect sensor changes, where the operation indication instruction is generated by the protective case based on a change of the output signal of the first Hall effect sensor and a change of the output signal of the second Hall effect sensor, and is used to instruct the terminal to perform a target operation, where the first Hall effect sensor and the first Hall effect sensor output signals by sensing a magnetic field; and the magnetic field is a magnetic field generated by a magnet built in the terminal, or a magnetic field generated by a magnet built in the protective case of the terminal, and the first Hall effect sensor and the second Hall effect sensor are disposed in the protective case.

In an embodiment of the present invention, the sending unit 2320 is specifically configured to perform at least one of the following steps:

sending a first operation indication instruction to the terminal in response to an operation of detecting that the output signal of the first Hall effect sensor changes into a first signal and the output signal of the second Hall effect sensor changes into a second signal, where the first operation indication instruction is generated by the protective case based on the first signal and the second signal, and is used to instruct the terminal to perform a first operation;

sending a second operation indication instruction to the terminal in response to an operation of detecting that the output signal of the first Hall effect sensor changes into a third signal and the output signal of the second Hall effect sensor changes into a fourth signal, where the second operation indication instruction is generated by the protective case based on the third signal and the fourth signal, and is used to instruct the terminal to perform a second operation; and sending a third operation indication instruction to the terminal in response to an operation of detecting that the output signal of the first Hall effect sensor changes into a fifth signal and the output signal of the second Hall effect sensor changes into a sixth signal, where the third operation indication instruction is generated by the protective case based on the fifth signal and the sixth signal, and is used to instruct the terminal to perform a third operation, where the first signal is an electrical signal output by the first Hall effect sensor when a magnetic field whose strength is not less than a first magnetic field strength passes through a working plane of the first Hall effect sensor from a first surface of the first Hall effect sensor, and the second signal is an electrical signal output by the second Hall effect sensor when a magnetic field whose strength is not less than a second magnetic field strength passes through a working plane of the second Hall effect sensor from a first surface of the second Hall effect sensor;

the third signal is an electrical signal output by the first Hall effect sensor when the magnetic field whose strength is not less than the first magnetic field strength passes through the working plane of the first Hall effect sensor from a second surface of the first Hall effect sensor, and the fourth signal is an electrical signal output by the second Hall effect sensor when the magnetic field whose strength is not less than the second magnetic field strength passes through the working plane of the second Hall effect sensor from a second surface of the second Hall effect sensor; and the fifth signal is an electrical signal output by the first Hall effect sensor when a magnetic field whose strength is less than the first magnetic field strength passes through the working plane of the first Hall effect sensor, and the sixth signal is an electrical signal output by the second Hall effect sensor when a magnetic field whose strength is less than the second magnetic field strength passes through the working plane of the second Hall effect sensor.

In an embodiment of the present invention, the first surface of the first Hall effect sensor and the second surface of the first Hall effect sensor are two opposite surfaces of the first Hall effect sensor, and both the first surface of the first Hall effect sensor and the second surface of the first Hall effect sensor are parallel to the working plane of the first Hall effect sensor; and the first surface of the second Hall effect sensor and the second surface of the second Hall effect sensor are two opposite surfaces of the second Hall effect sensor, and both the first surface of the second Hall effect sensor and the second surface of the second Hall effect sensor are parallel to the working plane of the Hall effect sensor.

In an embodiment of the present invention, the protective case includes a base plate and a flip plate that are used to fasten the terminal, and a flip shaft that connects the base plate and the flip plate; and the first Hall effect sensor and the second Hall effect sensor are disposed in the flip plate, and the magnet is disposed in the terminal or the base plate of the protective case; or the first Hall effect sensor and the second Hall effect sensor are disposed in the base plate, and the magnet is disposed in the flip plate.

In an embodiment of the present invention, the magnet is a strip magnet, and the working plane of the first Hall effect sensor is parallel to the working plane of the second Hall effect sensor; and when the protective case is in a closed state, a connection line between a north pole of the magnet and a south pole of the magnet is parallel to the working plane of the first Hall effect sensor, and a distance between the first Hall effect sensor or the second Hall effect sensor and a projection of the strip magnet onto a plane on which the working plane of the first Hall effect sensor is located is greater than a first distance threshold.

In an embodiment of the present invention, the magnet includes a first magnet and a second magnet, the first magnet generates the magnetic field whose strength is not less than the first magnetic field strength, and the second magnet generates the magnetic field whose strength is not less than the second magnetic field strength.

The technical terms used in the embodiments of the present invention are merely used to describe specific embodiments, but are not intended to limit the present invention. In this specification, singular forms "one", "this", and "the" are intended to include plural forms unless otherwise specified in the context clearly. Further, the term "include" and/or "contain" used in this specification refers to presence of features, entirety, steps, operations, elements, and/or components, but does not exclude presence or addition of one or more other features, entirety, steps, operations, elements, and/or components.

In the appended claims, the corresponding structures, materials, actions, and equivalent forms (if any) of all apparatuses or steps and functional elements are intended to include any structure, material, or action that is used to perform the function with reference to other explicitly required elements. The descriptions of the present invention are given for the purposes of the embodiments and the descriptions, but are not intended to be exhaustive or limit the present invention to the disclosed form.

What is claimed is:

1. A terminal control method, comprising:
    detecting that an output signal of a first Hall effect sensor changes into a first signal and an output signal of a second Hall effect sensor changes into a second signal, wherein the first signal is output by the first Hall effect sensor when a magnetic field whose strength is not less than a first magnetic field strength passes through a working plane of the first Hall effect sensor from a first surface of the first Hall effect sensor, and wherein the second signal is output by the second Hall effect sensor when a magnetic field whose strength is not less than a second magnetic field strength passes through a working plane of the second Hall effect sensor from a first surface of the second Hall effect sensor;
    detecting that an output signal of the first Hall effect sensor changes into a third signal and an output signal of the second Hall effect sensor changes into a fourth signal, wherein the third signal is output by the first Hall effect sensor when a magnetic field whose strength is not less than the first magnetic field strength passes through the working plane of the first Hall effect sensor from a second surface of the first Hall effect sensor that is different from the first surface of the first Hall effect sensor, and wherein the fourth signal is output by the second Hall effect sensor when a magnetic field whose strength is not less than the second magnetic field strength passes through the working plane of the second Hall effect sensor from a second surface of the second Hall effect sensor that is different from the first surface of the second Hall effect sensor; and
    performing a screen off operation in response to the detecting the output signal of the first Hall effect sensor changes into the first signal and the output signal of the second Hall effect sensor changes into the second signal, wherein the magnetic field is generated by a magnet built in a terminal or by a magnet built in a protective case of the terminal.

2. The method according to claim 1, wherein the first surface of the first Hall effect sensor and the second surface of the first Hall effect sensor are two opposite surfaces of the first Hall effect sensor, wherein both the first surface of the first Hall effect sensor and the second surface of the first Hall effect sensor are parallel to the working plane of the first Hall effect sensor, wherein the first surface of the second Hall effect sensor and the second surface of the second Hall effect sensor are two opposite surfaces of the second Hall effect sensor, and wherein both the first surface of the second Hall effect sensor and the second surface of the second Hall effect sensor are parallel to the working plane of the second Hall effect sensor.

3. The method according to claim 1, wherein the first Hall effect sensor and the second Hall effect sensor are disposed in the protective case, wherein before performing the screen off operation, the method further comprises receiving an operation indication instruction from the protective case, wherein the operation indication instruction is generated by the protective case based on a change of the output signal of the first Hall effect sensor and a change of the output signal of the second Hall effect sensor, and wherein the operation indication instruction instructs the terminal to perform the screen off operation.

4. The method according to claim 1, wherein the magnet is a strip magnet, and wherein the protective case comprises:
    a base plate and a flip plate used to fasten the terminal; and
    a flip shaft connecting the base plate and the flip plate, wherein the strip magnet is disposed in the flip plate of the protective case, and wherein the first Hall effect sensor and the second Hall effect sensor are disposed in the terminal or the base plate of the protective case.

5. The method according to claim 1, wherein the magnet is a strip magnet, wherein the terminal comprises a first body, a second body, and a flip shaft that connects the first body and the second body, wherein the first Hall effect sensor and the second Hall effect sensor are disposed in the first body, and wherein the strip magnet is disposed in the second body.

6. The method according to claim 4, wherein the working plane of the first Hall effect sensor is parallel to the working plane of the second Hall effect sensor, wherein when the terminal is in a closed state, a connection line between a north pole of the magnet and a south pole of the magnet is parallel to the working plane of the first Hall effect sensor, and wherein a distance between the first Hall effect sensor or the second Hall effect sensor and a projection of the strip magnet onto a plane on which the working plane of the first Hall effect sensor is located is greater than a first distance threshold.

7. The method according to claim 1, wherein the magnet comprises a first magnet and a second magnet, wherein the first magnet generates the magnetic field whose strength is not less than the first magnetic field strength, and wherein the second magnet generates the magnetic field whose strength is not less than the second magnetic field strength.

8. A terminal, comprising:
    a memory storing executable instructions; and
    a processor coupled to the memory, wherein the processor is configured to execute the instructions to:
        detect that an output signal of a first Hall effect sensor changes into a first signal and an output signal of a second Hall effect sensor changes into a second signal, wherein the first signal is output by the first Hall effect sensor when a magnetic field whose strength is not less than a first magnetic field strength passes through a working plane of the first Hall effect sensor from a first surface of the first Hall effect sensor, and wherein the second signal is output by the second Hall effect sensor when the magnetic field whose strength is not less than a second magnetic field strength passes through the working plane of the second Hall effect sensor from a first surface of the second Hall effect sensor;
        detect that an output signal of the first Hall effect sensor changes into a third signal and an output signal of the second Hall effect sensor changes into a fourth signal, wherein the third signal is output by the first Hall effect sensor when a magnetic field whose strength is not less than the first magnetic field strength passes through the working plane of the first Hall effect sensor from a second surface of the first Hall effect sensor that is different from the first surface of the first Hall effect sensor, and wherein the fourth signal is output by the second Hall effect sensor when a magnetic field whose strength is not less than the second magnetic field strength passes through the working plane of the second Hall effect sensor from a second surface of the second Hall effect sensor that is different from the first surface of the second Hall effect sensor; and perform a screen off operation in response to detecting that the output signal of the first Hall effect sensor changes into the first signal and the output signal of the second Hall effect sensor changes into the second signal, wherein the magnetic field is generated by a magnet built in the terminal or by a magnet built in a protective case of the terminal.

9. The terminal according to claim 8, wherein the first surface of the first Hall effect sensor and the second surface of the first Hall effect sensor are two opposite surfaces of the first Hall effect sensor, wherein both the first surface of the first Hall effect sensor and the second surface of the first Hall effect sensor are parallel to the working plane of the first Hall effect sensor, wherein the first surface of the second Hall effect sensor and the second surface of the second Hall effect sensor are two opposite surfaces of the second Hall effect sensor, and wherein both the first surface of the second Hall effect sensor and the second surface of the second Hall effect sensor are parallel to the working plane of the Hall effect sensor.

10. The terminal according to claim 8, wherein the first Hall effect sensor and the second Hall effect sensor are disposed in the protective case, wherein before performing the on operation, the processor is further configured to receive an operation indication instruction from the protective case, wherein the operation indication instruction is generated by the protective case based on a change of the output signal of the first Hall effect sensor and a change of the output signal of the second Hall effect sensor, and wherein the operation indication instruction instructs the terminal to perform the on operation.

11. The terminal according to claim 10, wherein the magnet is a strip magnet, wherein the protective case comprises:

a base plate and a flip plate used to fasten the terminal; and
a flip shaft connecting the base plate and the flip plate,
wherein the strip magnet is disposed in the flip plate of the protective case, and wherein the first Hall effect sensor and the second Hall effect sensor are disposed in the terminal or the base plate of the protective case.

12. The terminal according to claim 8, wherein the magnet is a strip magnet, wherein the terminal comprises a first body, a second body, and a flip shaft that connects the first body and the second body, wherein the first Hall effect sensor and the second Hall effect sensor are disposed in the first body, and wherein the strip magnet is disposed in the second body.

13. The terminal according to claim 11, wherein the working plane of the first Hall effect sensor is parallel to the working plane of the second Hall effect sensor, wherein when the terminal is in a closed state, a connection line between a north pole of the magnet and a south pole of the magnet is parallel to the working plane of the first Hall effect sensor, and wherein a distance between the first Hall effect sensor or the second Hall effect sensor and a projection of the strip magnet onto a plane on which the working plane of the first Hall effect sensor is located is greater than a first distance threshold.

14. The terminal according to claim 8, wherein the magnet comprises a first magnet and a second magnet, wherein the first magnet generates the magnetic field whose strength is not less than the first magnetic field strength, and wherein the second magnet generates the magnetic field whose strength is not less than the second magnetic field strength.

15. A protective case, comprising:
a base plate and a flip plate that are used to fasten a terminal; and
a flip shaft connecting the base plate and the flip plate,
wherein a status of the protective case changes by using the flip shaft,
wherein the first Hall effect sensor and the second Hall effect sensor are disposed in the base plate or the terminal and the magnet is disposed in the flip plate,
wherein the first Hall effect sensor and the first Hall effect sensor output signals by sensing a magnetic field, and
wherein the protective case is configured to instruct the terminal to perform a screen off operation in response to detecting that an output signal of the first Hall effect sensor changes into a first signal and an output signal of the second Hall effect sensor changes into a second signal, wherein the first signal is output by the first Hall effect sensor when a magnetic field whose strength is not less than a first magnetic field strength passes through the working plane of the first Hall effect sensor from a first surface of the first Hall effect sensor, and wherein the second signal is output by the second Hall effect sensor when a magnetic field whose strength is not less than a second magnetic field strength passes through the working plane of the second Hall effect sensor from a first surface of the second Hall effect sensor.

16. The protective case according to claim 15, wherein when the protective case is in a flip-up state, a magnetic field whose strength is not less than a first magnetic field strength and that is generated by the magnet passes through a working plane of the first Hall effect sensor from a first surface, the first Hall effect sensor outputs a first signal, a magnetic field whose strength is not less than a second magnetic field strength and that is generated by the magnet passes through a working plane of the second Hall effect sensor from the first surface, and the second Hall effect sensor outputs a second signal;

wherein when the protective case is in a flip-back state, the magnetic field whose strength is not less than the first magnetic field strength and that is generated by the magnet passes through the working plane of the first Hall effect sensor from a second surface, the first Hall effect sensor outputs a third signal, the magnetic field whose strength is not less than the second magnetic field strength and that is generated by the magnet passes through the working plane of the second Hall effect sensor from the second surface, and the second Hall effect sensor outputs a fourth signal; and wherein when the protective case is in an expanded state, a magnetic field whose strength is less than the first magnetic field strength and that is generated by the magnet passes through the working plane of the first Hall effect sensor, the first Hall effect sensor outputs a fifth signal, a magnetic field whose strength is less than the second magnetic field strength and that is generated by the magnet passes through the working plane of the second Hall effect sensor, and the second Hall effect sensor outputs a sixth signal.

* * * * *